United States Patent [19]
Pan

[11] Patent Number: 6,085,209
[45] Date of Patent: *Jul. 4, 2000

[54] METHOD AND SYSTEM FOR PERFORMING AN IIR FILTERING OPERATION

[75] Inventor: Shao Wei Pan, Schaumburg, Ill.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/999,618

[22] Filed: Jul. 28, 1997

Related U.S. Application Data

[63] Continuation of application No. 08/519,910, Aug. 28, 1995, abandoned.

[51] Int. Cl.[7] .............................. G06F 17/10; G06F 7/00
[52] U.S. Cl. ........................................... 708/320; 708/517
[58] Field of Search ..................... 364/715.011, 715.03, 364/718, 722, 735, 736.01, 748.5, 754, 761, 724.011, 724.17, 724.19; 708/277, 512, 517, 300, 301, 303, 320

[56] References Cited

U.S. PATENT DOCUMENTS

| | | | |
|---|---|---|---|
| 4,305,133 | 12/1981 | Amada et al. | 364/724 |
| 4,682,302 | 7/1987 | Williams | 364/768 |
| 4,720,809 | 1/1988 | Taylor | 364/748 |
| 5,042,001 | 8/1991 | Brightman et al. | 364/736 |
| 5,068,816 | 11/1991 | Noetzel | 364/718 |
| 5,157,623 | 10/1992 | Hayashi | 364/724.17 |
| 5,331,582 | 7/1994 | Sudo et al. | 364/722 |

OTHER PUBLICATIONS

A 10-ns Hybrid Number System Data Execution Unit for Digital Signal Processing Systems by Fang-shi Lai, IEEE Journal of Solid-State Circuits, vol. 26, No. 4, Apr. 1991, pp. 590-599.

A Hybrid Number System Processor with Geometric and Complex Arithmetic Capabilities by Fang-shi Lai, and Ching-Farn Eric Wu, IEEE Transactions on Computers, vol. 40, No. 8, Aug. 1991, pp. 952-960.

A 3.84 GIPS Integrated Memory Array Processor with 64 Processing Elements and a 2-Mb SRAM by Nobuyuki Yamashita, Tohru Kimura, Yoshihiro Fujita, Yoshiharu Aimoto, Takashi Manabe, Shin'ichiro Okazaki, Kazuyuki Nakamura, and Masakazu Yamashina, IEEE Journal of Solid-State Circuits, vol. 29, No. 11, Nov. 1994, pp. 1336-1343.

"The Efficient Implementation and Analysis of a Hybrid Number System Processor" by Fang-shi Lai, IEEE Transactions on Circuits and Systems-II: Analog and Digital Signal Processing, vol. 40, No. 6, Jun. 1993.

*Primary Examiner*—Chuong Dinh Ngo
*Attorney, Agent, or Firm*—James E. Gauger

[57] ABSTRACT

A method and system for an IIR filter are provided. A sequence of input signals is converted to a first sequence of log signals, while a sequence of feedback signals is converted to a second sequence of log signals. IIR filtering coefficients are then added to each sequence of log signals to generate a plurality of term signals. The term signals are then converted to inverse-log signals which are summed to produce an output signal. The log/inverse-log conversions of signals are based on estimating a log/inverse-log function using a second-order polynomial.

30 Claims, 12 Drawing Sheets

| EXPONENT CODE | EXPONENT SIGNAL | MUX SIGNAL 1 | MUX SIGNAL 2 | ADDER ENABLE | MUX SIGNAL 3 | CARRY BIT |
|---|---|---|---|---|---|---|
| 000 | $x^{-1}$ | X | INVERT | 0 | MUX 2 OUTPUT | 1 |
| 001 | $x^{-1/2}$ | 1 RIGHT | INVERT | 1 | ADDER 1 OUTPUT | 1 |
| 010 | $x^{1/2}$ | 1 RIGHT | X | 0 | MUX 1 OUTPUT | 0 |
| 011 | $x^{1}$ | PASS | X | 0 | MUX 1 OUTPUT | 0 |
| 100 | $x^{2}$ | 1 LEFT | X | 0 | MUX 1 OUTPUT | 0 |
| 101 | $x^{3}$ | 1 LEFT | PASS | 1 | ADDER 1 OUTPUT | 0 |
| 110 | $x^{4}$ | X | 2 LEFT | 0 | MUX 2 OUTPUT | 0 |
| 111 | $x^{5}$ | PASS | 2 LEFT | 1 | ADDER 1 OUTPUT | 0 |

FIG. 4

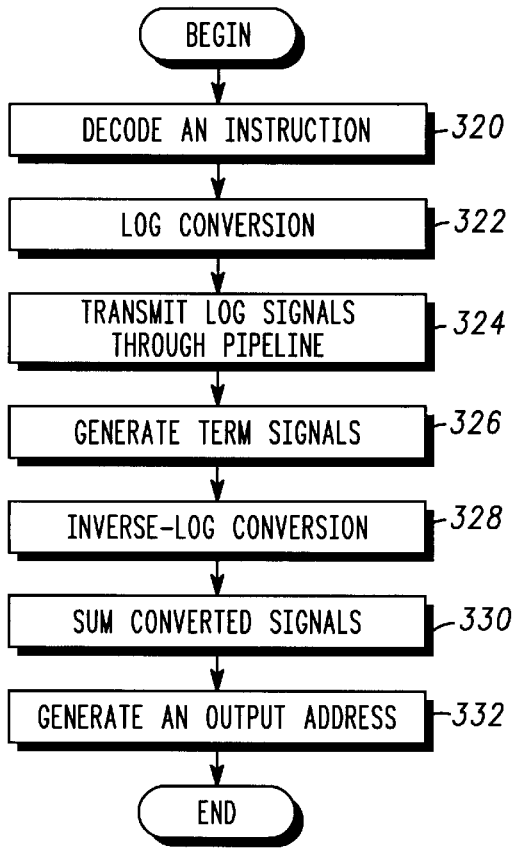
*FIG.14*
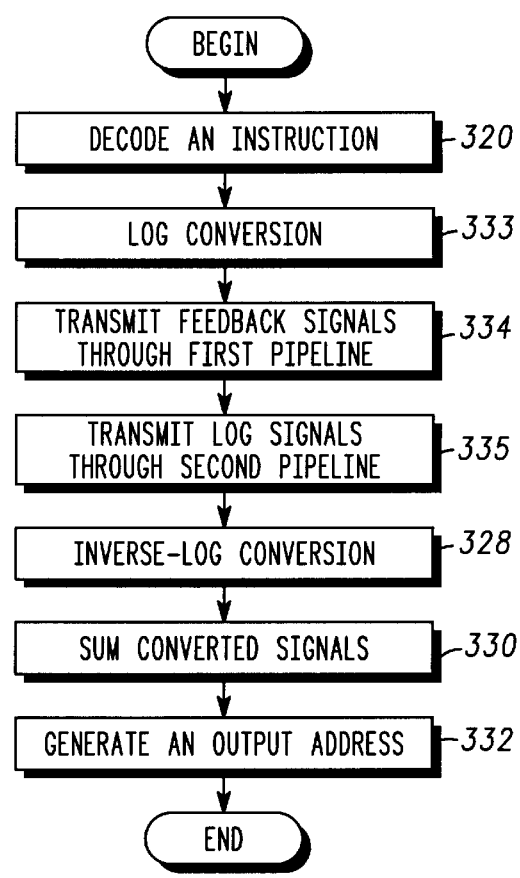
*FIG.15*
*FIG.16*
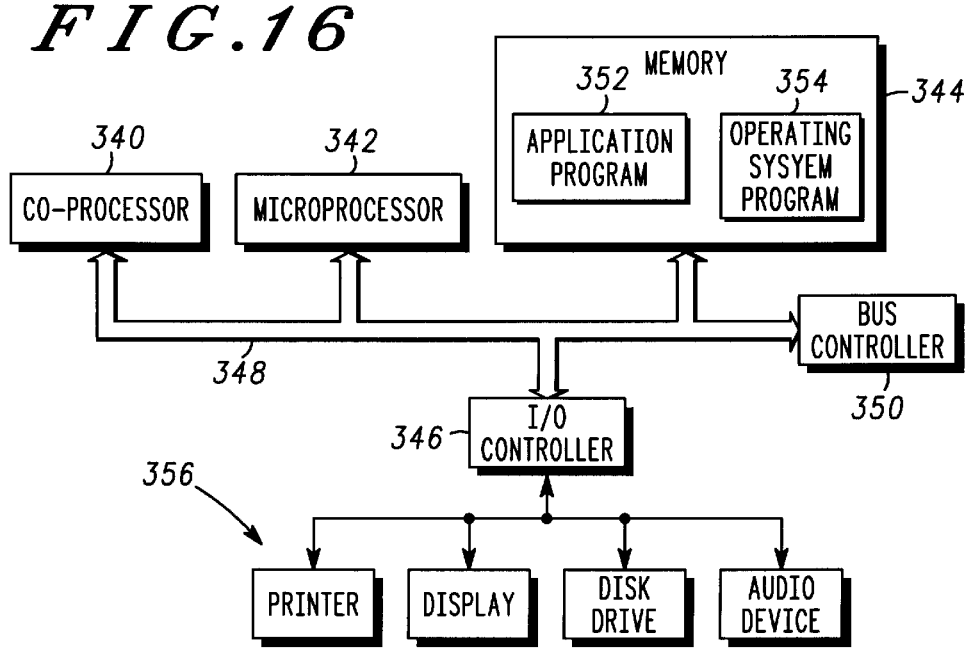

METHOD AND SYSTEM FOR PERFORMING AN IIR FILTERING OPERATION

This is a continuation of application Ser. No. 08/519,910, filed Aug. 28, 1995 and now abandoned.

RELATED INVENTIONS

The present invention is related to the following inventions which are assigned to the same assignee as the present invention:

(1) "Computer Processor Utilizing Logarithmic Conversion and Method of Use thereof", U.S. Pat. No. 5,685,008.

(2) "Exponentiator Circuit Utilizing Shift Register and Method of Using Same", U.S. Pat. No. 5,553,012.

(3) "Accumulator Circuit and Method of Use Thereof", U.S. Pat. No. 5,644,520.

(4) "Logarithm/Inverse-Logarithm Converter and Method of Using Same", U.S. Pat. No. 5,642,305.

(5) "Logarithm/Inverse-Logarithm Converter Utilizing Second-Order Term and Method of Using Same", U.S. Pat. No. 5,703,801.

(6) "Logarithm/Inverse-Logarithm Converter Utilizing Linear Interpolation and Method of Using Same", U.S. Pat. No. 5,600,581.

(7) "Logarithm/Inverse-Logarithm Converter Utilizing a Truncated Taylor Series and Method of Use Thereof", U.S. Pat. No. 5,604,691.

(8) "Logarithm Converter Utilizing Offset and Method of Use Thereof", U.S. Pat. No. 5,629,884.

The subject matter of the above-identified related inventions is hereby incorporated by reference into the disclosure of this invention.

TECHNICAL FIELD OF THE INVENTION

The present invention relates generally to digital signal processing and, in particular, to a method and system for implementing a digital Infinite Impulse Response (IIR) filter.

BACKGROUND OF THE INVENTION

Computer processors are well known and widely used for a variety of purposes. One application of computer processors is digital signal processing (DSP). By definition, digital signal processing is concerned with the representation of signals by sequences of numbers or symbols and the processing of these signals. DSP has a wide variety of applications and its importance is evident in such fields as pattern recognition, radio communications, telecommunications, radar, biomedical engineering, and many others.

At the heart of every DSP system is a computer processor that performs mathematical operations on signals. Generally, signals received by a DSP system are first converted to a digital format used by the computer processor. Then, the computer processor executes a series of mathematical operations on the digitized signal. The purpose of these operations may be to estimate characteristic parameters of the signal or to transform the signal into a form that is in some sense more desirable. Such operations typically implement complicated mathematics and entail intensive numerical processing. Examples of mathematical operations that may be performed in DSP systems include matrix multiplication, matrix-inversion, Fast Fourier Transforms (FFT), auto and cross correlation, Discrete Cosine Transforms (DCT), polynomial equations, and difference equations in general, such as those used to approximate Infinite Impulse Response (IIR) and Finite Impulse Response (FIR) filters.

Computer processors vary considerably in design and function. One aspect of a processor design is its architecture. Generally, the term computer architecture refers to the instruction set and organization of a processor. An instruction set is a group of programmer-visible instructions used to program the processor. The organization of a processor, on the other hand, refers to its overall structure and composition of computational resources, for example, the bus structure, memory arrangement, and number of processing elements. A processing element, in a broad sense, is a device in a computer processor that performs logical or arithmetical operations on data it receives. For example, a processing element may be as simple as an adder circuit that sums two values, or it may be a complex as a central processing unit (CPU) that performs a wide variety of different operations.

In a computer, a number of different organizational techniques may be used for increasing execution speed. One technique is execution overlap. Execution overlap is based on the notion of operating a computer like an assembly line with an unending series of operations in various stages of completion. Execution overlap allows these operations to be overlapped and executed simultaneously.

One commonly used form of execution overlap is pipelining. In a computer, pipelining is an implementation technique that allows a sequence of the same operations to be performed on different arguments. Computation to be done for a specific instruction is broken into smaller pieces, i.e., operations, each of which takes a fraction of the time needed to complete the entire instruction. Each of these pieces is called a pipe stage, or simply a stage. The stages are connected in a sequence to form a pipeline— arguments of the instruction enter at one end, are processed through the stages, and exit at the other end.

There are many different architectures, ranging from complex-instruction-set-computer (CISC) to reduced-instruction-set-computer (RISC) based architectures. In addition, some architectures have only one processing element, while others include two or more processing elements. Despite differences in architectures, all computer processors have a common goal, which is to provide the highest performance at the lowest cost. However, the performance of a computer processor is highly dependent on the problem to which the processor is applied, and few, if any, low-cost computer processors are capable of performing the mathematical operations listed above at speeds required for some of today's more demanding applications. For example, MPEG data compression of an NTSC television signal can only be performed using expensive supercomputers or special purpose hardware.

Many other applications, such as matrix transformations in real-time graphics, require data throughput rates that exceed the capabilities of inexpensive, single processors, such as microprocessors and commercially available DSP chips. Instead, these applications require the use of costly, multiprocessor or multiple-processor computers. Although multiprocessor computers typically have higher throughput rates, they also include complex instruction sets and are generally difficult to program.

Thus, there is a need for a computer processor that executes mathematical operations at high speeds, while remaining inexpensive. There is also a need for a computer processor that has a simple instruction set and is easily programmed to provide the desired mathematical operations. In addition, there is a need for a computer processor that enjoys a high data throughput rate. Such a processor should also be small and consume relatively little power.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 4 is a table illustrating exponent codes that can be used with the processing element of FIG. 3.

FIG. 14 shows a flow diagram of a method of using one of the computer processors shown in FIGS. 1, 5 and 9 to generate at least one output signal.

FIG. 15 shows a flow diagram of a method of using one of the computer processors shown in FIGS. 11–13 to generate output signals.

FIG. 16 shows a block diagram of a digital computer system that incorporates a computer processor embodying the present invention.

DETAILED DESCRIPTION OF A PREFERRED EMBODIMENT

Generally, the present invention provides a method and system for digitally filtering input signals to generate at east one output signal. The input and output signals can be either analog or digital signals that represent numeric data.

An advantage of the present invention is that it provides a method and system that is capable of performing sophisticated mathematical operations, such as those used in a digital IIR filter, at high processing speeds. This method and system can be implemented using a computer processor that can also be used for matrix multiplication, matrix-inversion, Fast Fourier Transforms (FFT), auto and cross correlation, Discrete Cosine Transforms (DCT), polynomial equations, L1 and L2 norm calculations, and difference equations in general, such as those used to approximate Finite Impulse Response (FIR) filters. Another advantage of the present invention is that it provides an IIR filter that has a high data throughput rate. A further advantage of the present invention is that it provides an IIR filter that is efficiently implemented in a microchip, and is consequently small and consumes relatively little power.

Figure 1:
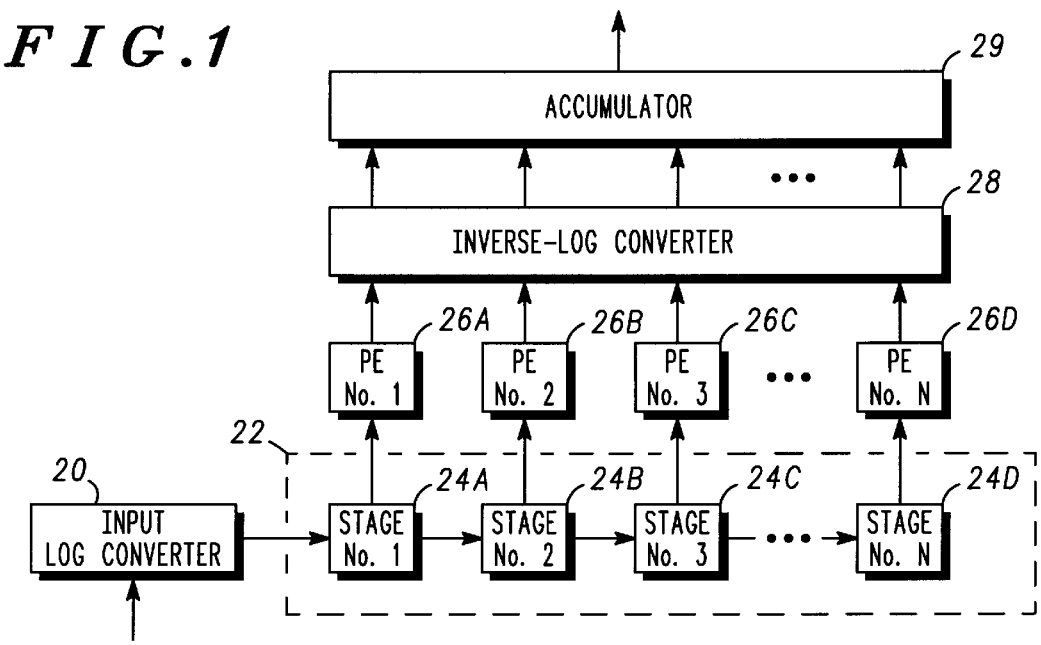
FIG. 1 illustrates a block diagram of a first computer processor that can incorporate an embodiment of the present invention.

FIG. 1 illustrates a block diagram of a first computer processor that can incorporate an embodiment of the present invention. The computer processor comprises an input log converter 20, a data pipeline 22, a plurality of processing elements 26a–d, an inverse-log converter 28, and an accumulator 29. The data pipeline 22 includes plurality of stages 24a–d having a one-to-one correspondence with the processing elements 26a–d.

Operation of the processor begins when a plurality of input signals is received by the input log converter 20. In response to the inputs, the input log converter 20 generates a plurality of log signals that are in turn received by a first stage 24a of the data pipeline 22. The data pipeline 22 sequentially provides the log signals at each of the stages 24a–d. Each of the processing elements 26a–d is operatively coupled to and receives log signals by way of a respective stage. The respective stage can be any one of the stages 24a–d in the data pipeline 22. As shown, the first processing element 26a is connected to the first stage 24a; the second processing element 26b is connected to the second stage 24b; the third processing element 26c is connected to the third stage 24c; and the fourth processing element 26d is connected to the fourth stage 24d. Each processing element 26a–d generates a term signal in response to each log signal. The inverse-log converter 28 performs inverse-logarithmic conversion on the term signals to generate a plurality of inverse-log signals that are received by the accumulator 29. The accumulator 29 sums the inverse-log signals to produce an output signal.

The data pipeline 22 includes any means for buffering a sequence of log signals, such as a plurality of registers or a multi-port memory. In the example shown, the stages 24a–d represent registers that are arranged to simultaneously provide a sequence of log signals to the processing elements 26a–d. For example, if the first stage 24a contains a log signal x(t), where t represents a discrete time, then the second stage 24b contains x(t−1), the third stage 24c contains x(t−2), and the nth stage 24d contains x(t−n).

Each processing element 26a–d performs one or more operations that result in at least one term value being generated as output. In one embodiment of the present invention, each processing element 26a–d produces a term signal that is based on an equation:

$$y = w + x \qquad \text{Equation 1}$$

where y represents the term signal, w represents a coefficient value, and x represents one of the log signals.

In a preferred embodiment of the present invention, each processing element 26a–d generates the term signal based on the following equation:

$$y = w + \sum_{i=m}^{n} g_i x_i \quad \text{Equation 2}$$

where y represents the term signal, w represents a coefficient value, $x_i$ represents an ith log signal received by the processing element, $g_i$ represents an exponent value corresponding to the ith log signal, and i, m and n are any integers.

Each processing element can include a cache memory (not shown) for storing at least one exponent and coefficient value. In such case, the processing elements 26a–d receive an address concomitant with each log signal. The address is used to retrieve from the cache memory a respective coefficient and exponent value.

In addition to producing the output signals, the accumulator 29 can also generate output addresses concomitant with the output signals. The output addresses can be used by external devices to identify individual output signals. In one embodiment of the present invention, the output addresses are stored in read-only-memories (ROMs, not shown) that are located in the processing elements 26a–d. The processing elements 26a–d pass the output addresses to the accumulator 29. Each inverse-log signal has an associated output address. In circumstances where inverse-log signals are combined into a single output signal, the accumulator 29 selects one associated output address to be produced with the output signal.

Figure 2:
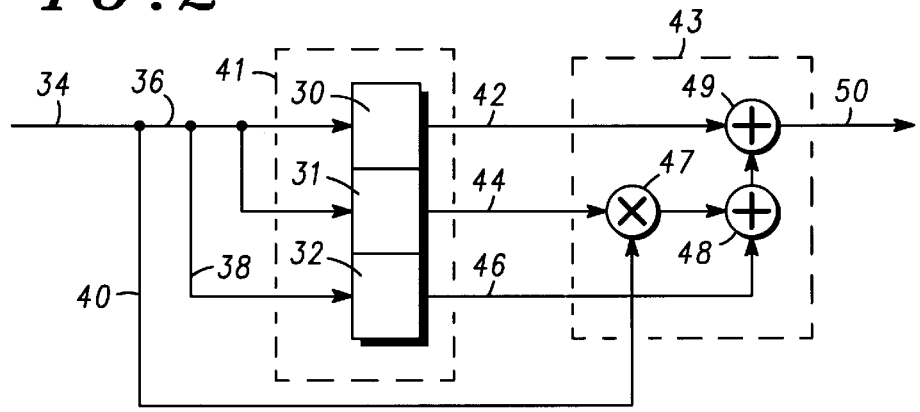
FIG. 2 shows a block diagram of a converter circuit used in either the log or inverse-log converter shown in FIG. 1.

FIG. 2 shows a detailed block diagram of a converter circuit used in either the input log converter 20 or inverse-log converter 28 shown in FIG. 1. In a preferred embodiment of the present invention, the input log converter 20 and the inverse-log converter 28 include the log/inverse-log converter disclosed in above-identified Related Invention No. 4. However, it will be realized by one skilled in the art that any other log/inverse-log converter, including those disclosed in above-identified Related Inventions Nos. 5–8, could instead be incorporated in either the log converter 20 or the inverse-log converter 28.

The converter circuit can be analogously used to compute either log or inverse-log signals; thus, for the sake of brevity, the following will describe using the converter circuit to generate log signals, with the understanding that the converter circuit may be used in a like manner to compute inverse-log signals.

The converter circuit comprises a memory 41 and a signal generator 43. The memory 41 stores a plurality of parameters and provides as output at least one parameter associated with each input signal. The signal generator 43 receives the input signals and the parameters and, in turn, generates the log signals by estimating a logarithmic function with a polynomial.

The signal generator 43 includes a multiplier 47, a first adder 48, and a second adder 49. The memory 41 stores a plurality of second-order terms in a second-order look-up table 32 and a plurality of parameter pairs. The at least one parameter includes the second-order terms and the parameter pairs. The parameter pairs and second-order terms are calculated using a least squares method to estimate a log function over a domain of input signals. Each parameter pair has a zero-order parameter, which is stored in a zero-order look-up table 30, and a first-order parameter that is stored in a first-order look-up table 31.

The converter operates as follows. An input signal 34 provides an address 36 that is used to retrieve a corresponding parameter pair from the zero-order and first-order look-up tables 30,31. The input signal 34 is a binary value having a length of 23-bits, denoted by [22:0], wherein the most significant nine bits [22:14] of the input signal 34 are provided to the memory 41 as the address 36. A term address 38 is also derived from the input signal 34. The term address 38 is used to retrieve the second-order term 46 from the second-order look-up table 32. The input signal 34 is a digital word having an upper and a lower portion, where the upper portion includes the most significant nine bits [22:14] and the lower portion includes the remaining 14 bits [13:0]. The term address 38 is a nine-bit value, which comprises the most significant four bits of the upper portion concatenated with the most significant five bits of the lower portion, i.e., bits [22:19] [13:9] of input signal 34.

The zero-order parameter 42 is a 24-bit binary value, the first-order parameter 44 is a 15-bit value, and the second-order term 46 is a 9-bit value. A total of 512 parameter pairs and 512 second-order terms are stored in the memory 41.

The multiplier 47 multiplies the first-order parameter 44 by a bit slice 40 to produce a proportional term. Although the bit slice 40 may include the entire input signal 34, it typically includes the fourteen least significant bits [13:0] of the input signal 34. The first adder 48 sums the proportional term and the second-order term 46 to produce a first sum. In turn, the second adder 49 sums the first sum and the zero-order parameter 42 to produce a log signal 50 that is 23 bits in length.

To use the converter circuit of FIG. 2 in the inverse-log converter 28, the memory 41 is loaded with a different set of parameters. These parameters include parameter pairs and second-order terms that are calculated using a least squares method to estimate an inverse-log function over the domain of the term signals, which are substituted for the input signals 34. Each of the term signals is provided as the input signal 34, and the log signal 50 is interpreted to mean the inverse-log signal.

The input signals of the computer processor of FIG. 1 can represent numeric values according to the IEEE standard 32-bit floating point format. Values represented as IEEE floating point numbers have one sign bit, a 23-bit mantissa, and an 8-bit exponent. Only the mantissa is provided to the converter circuit of FIG. 2 as the input signal 34. Both the sign bit and exponent bypass the converter circuit and are later combined with the log signal 50. This combination results in a value that is represented in a log number system (LNS) format having a sign bit, a j-bit fractional portion and a k-bit integer portion. The integers j and k can vary, depending on the desired precision of the converter.

Figure 3:
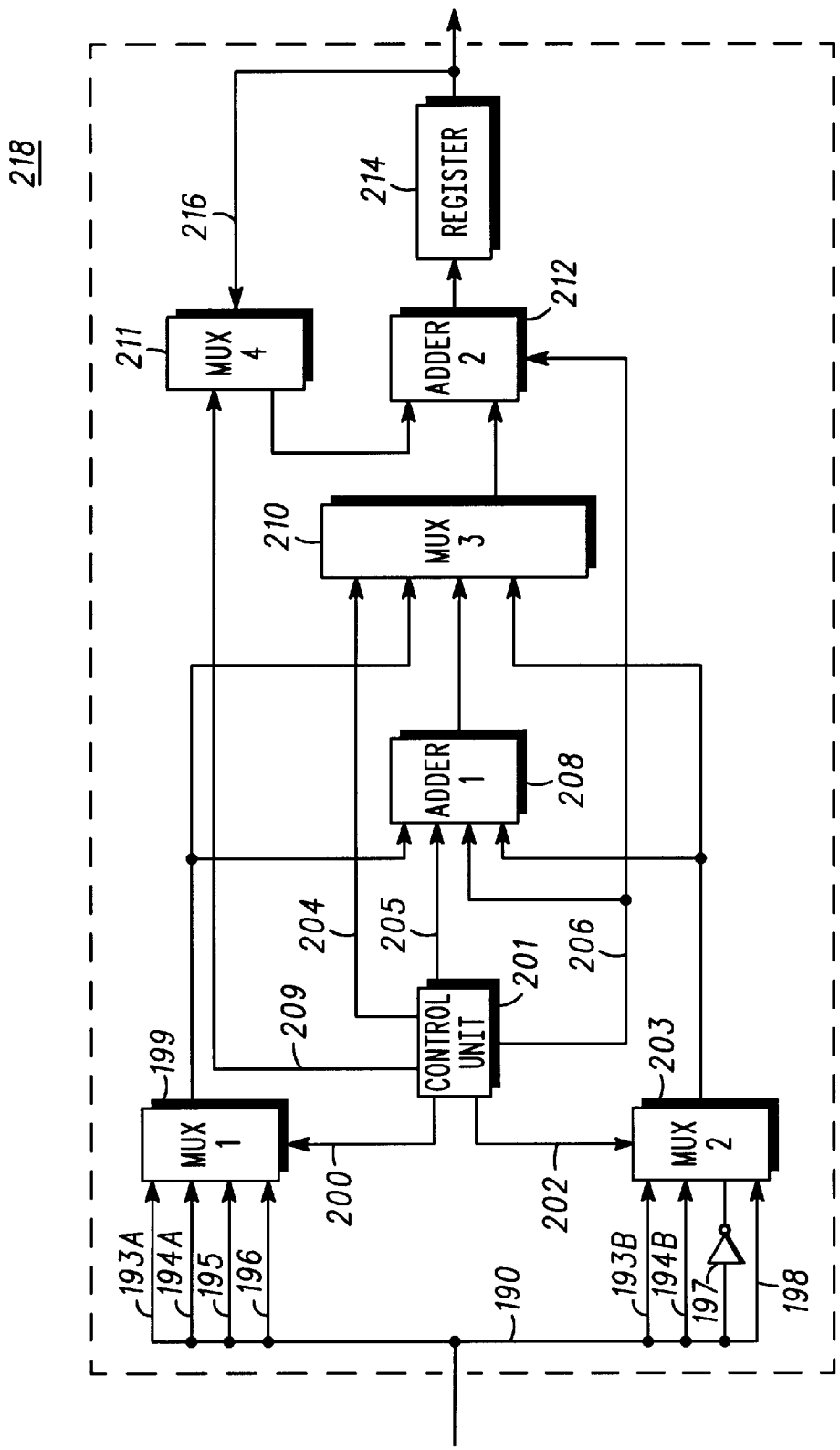
FIG. 3 shows a block diagram of a processing element utilized by the computer processor of FIG. 1.

FIG. 3 shows a detailed block diagram of an exemplary processing element 218 utilized by the computer processor of FIG. 1. The internal structure of each processing element 26a–d is preferably based on the architectures disclosed in above-identified Related Invention No. 2. The processing element 218 includes a first multiplexer (mux) 199, a second multiplexer 203, a third multiplexer 210, a fourth multiplexer 211, a first adder circuit 208, a second adder circuit 212, a register 214, and a control unit 201.

The log signals received from the respective stage are distributed by a bus 190 to the first multiplexer 199 and the second multiplexer 203. Each multiplexer selects from one of four inputs. Both the first and second multiplexers have pass inputs 193a–b and zero inputs 194a–b. In addition, the first multiplexer 199 has a 1-bit shift left input 195 and a 1-bit shift right input 196; while the second multiplexer 203 has an inverted input 197 and a 2-bit shift left input 198. The inputs to the first and second multiplexers 199, 203 are respectively selected according to a first mux signal 200 and a second mux signal 202.

The various inputs to the first and second multiplexers 199, 203 comprise different bit-slices of a received log signal. For instance, the pass inputs 193a–b simply provide the received log signal in its pristine state, whereas the zero inputs 194a–b are digital words with all bits set to zero. On the other hand, the 1-bit shift left input 195 effectively provides the log signal having been shifted one bit to the left. This is accomplished by connecting the right-most n-1 bits of the bus 192 to the left-most n-1 bits of the 1-bit shift left input 195, where n is the number of bits in the log signal. Zero is provided to the least significant bit (right-most bit) of the 1-bit shift left input 195. The 2-bit shift left input 198 effectively provides the log signal having been shifted two bits to the left. This is accomplished by connecting the right-most n-2 bits of the bus 192 to the left-most n-2 bits of the 2-bit shift left input 198. Zero is provided to the two least significant bits of the 2-bit shift left input 198. The 1-bit shift right input 196 effectively provides the log signal having been shifted one bit to the right. This is accomplished by connecting the left-most n-1 bits of the bus 192 to the right-most n-1 bits of the multiplexer input. Zero is provided to the most significant bit (left-most bit) of the multiplexer input. The inverted input 197 is created by inverting the bits of the log signal. This provides the 1's-complement form of the log signal.

The first adder circuit 208 sums the outputs of the first and second multiplexers 199, 203. The first adder 208 is also responsive to a carry bit 206 and an adder enable signal 205. The output of the first adder 208 is fed to the third multiplexer 210. The third multiplexer 210 selects either the output of the first multiplexer 199, second multiplexer 203, or first adder circuit 208 according to a third mux signal 204 that is generated by the control unit 201.

The second adder 212 sums the outputs of the third multiplexer 210 and a stored value that is provided on a feedback path 216. The output of the second adder circuit 212 is stored in register 214. Initially, the register 214 can be pre-loaded with a value, such as a coefficient value or zero. The output of the register 214 is provided to the feedback path 216 as the term signals. The fourth multiplexer 211 selectively provides either the signal provided by the feedback path 216 or a coefficient value to the second adder 212. The coefficient value and a forth mux signal for selecting the mux output are provided via a fourth mux bus 209.

The control unit 201 typically includes a cache memory (not shown) for storing a plurality of exponent codes and coefficient values, where each stored value corresponds to a respective log signal. The processing element 218 receives a plurality of addresses concomitant with the log signals. The addresses are used by the control unit 201 to retrieve stored data values corresponding to the log signals. When a log signal is received by the processing element 218, the control unit 201 retrieves and decodes an associated exponent code to generate the first, second, third and fourth mux signals; the adder enable signal 205; and the carry bit 206. Depending on the function being performed by the computer processor, the control unit 201 may also retrieve a coefficient value for each log signal. For example, when the computer processor performs a linear function, such as an FIR or IIR filter, the control unit 201 provides a coefficient value to the second adder 212 for each log signal received by the processing element 218.

In operation, the processing element 218 can compute a term signal from a single input signal or a term signal computed from a sequence of input signals.

As described in conjunction with FIG. 2 of above-identified Related Invention No. 2, the processing elements can be implemented using a single adder circuit rather than two adder circuits. A single adder processing element can be used by an alternative embodiment of the present invention. Although this arrangement may incur slower summation by the processing element, it significantly reduces the amount of area required by the processing element when implemented using an integrated circuit.

FIG. 4 is a table illustrating exponent codes that can be used with the processing element 218 of FIG. 3. The table lists the codes and their corresponding mux signals that are used in the preferred embodiment of the present invention. The table also illustrates the values of the carry bit 206 and adder enable signal 205 generated in response to the each of the exponent codes. Each row in the table gives the values of the signals and the carry bit corresponding to one of the exponent codes.

For example, in the first row, the exponent code "000" indicates that $x^{-1}$ is to be generated by processing element 218. If the exponent code for an input signal is "000", then the first mux signal 200 is a don't care, the second mux signal 202 is set to select the inverted input 197, the adder enable signal is set to zero, thus disabling the first adder 208, the third mux signal 204 is set to select the output of the second multiplexer 203, and the carry bit 206 is set to one. In effect, the 2's-complement form of the log signal is generated by the second adder circuit 212.

In the second row, the exponent code "001" indicates that $x^{-\frac{1}{2}}$ is to be generated. If the exponent code is "001" for an input signal, then the first mux signal 200 is set to select the 1-bit shift right input 196, the second mux signal 202 is set to select the inverted input 197, the adder enable signal 205 is set to one, thus enabling the first adder 208, the third mux signal 204 is set to select the output of the first adder 208, and the carry bit 206 is set to one for the first adder 208 and zero for the second adder 212.

In the third row, the exponent code "010" indicates that $x^{1/2}$ is to be generated. If the exponent code is "010" for an input signal, then the first mux signal 200 is set to select the 1-bit shift right input 196, the second mux signal 202 is a don't care, the adder enable signal 205 is set to zero, the third mux signal 204 is set to select the output of the first multiplexer 199, and the carry bit 206 is set to zero.

In the fourth row, the exponent code "011" indicates that $x^1$ is to be generated. If the exponent code is "011" for an input signal, then the first mux signal 200 is set to select the pass input 193a, the second mux signal 202 is a don't care, the adder enable signal 205 is set to zero, the third mux signal 204 is set to select the output of the first multiplexer 199, and the carry bit 206 is set to zero.

In the fifth row, the exponent code "100" indicates that $x^2$ is to be generated. If the exponent code is "100" for an input signal, then the first mux signal 200 is set to select the 1-bit shift left input 195, the second mux signal 202 is a don't care, the adder enable signal 205 is set to zero, the third mux signal 204 is set to select the output of the first multiplexer 199, and the carry bit 206 is set to zero.

In the sixth row, the exponent code "101" indicates that $x^3$ is to be generated. If the exponent code is "101" for an input signal, then the first mux signal 200 is set to select the 1-bit shift left input 195, the second mux signal 202 is set to select the pass input 193b, the adder enable signal 205 is set to one, thus enabling the first adder 208, the third mux signal 204 is set to select the output of the first adder 208, and the carry bit 206 is set to zero.

In the seventh row, the exponent code "110" indicates that $x^4$ is to be generated. If the exponent code is "110" for an input signal, then the first mux signal 200 is a don't care, the second mux signal 202 is set to select the 2-bit shift left input 198, the adder enable signal 205 is set to zero, the third mux signal 204 is set to select the output of the second multiplexer 203, and the carry bit 206 is set to zero.

In the eighth row, the exponent code "111" indicates that $x^5$ is to be generated. If the exponent code for an input signal is "111", then the first mux signal 200 is set to select the pass input 193a, the second mux signal 202 is set to select the 2-bit shift left input 198, the adder enable signal 205 is set to one, the third mux signal 204 is set to select the output of the first adder 208, and the carry bit 206 is set to zero.

An exponent code may also be provided to indicate that $x^0$ is to be generated. Although such a code is not shown in FIG. 4, it could be easily implemented by providing an additional exponent code, such as "1000", which when decoded causes the first mux signal 200 to select the zero input 194b, the adder enable signal 205 to be zero, the third mux signal to select the output of the first multiplexer 199, and the carry bit to be zero. The second mux signal 202 is a don't care.

Figure 5:
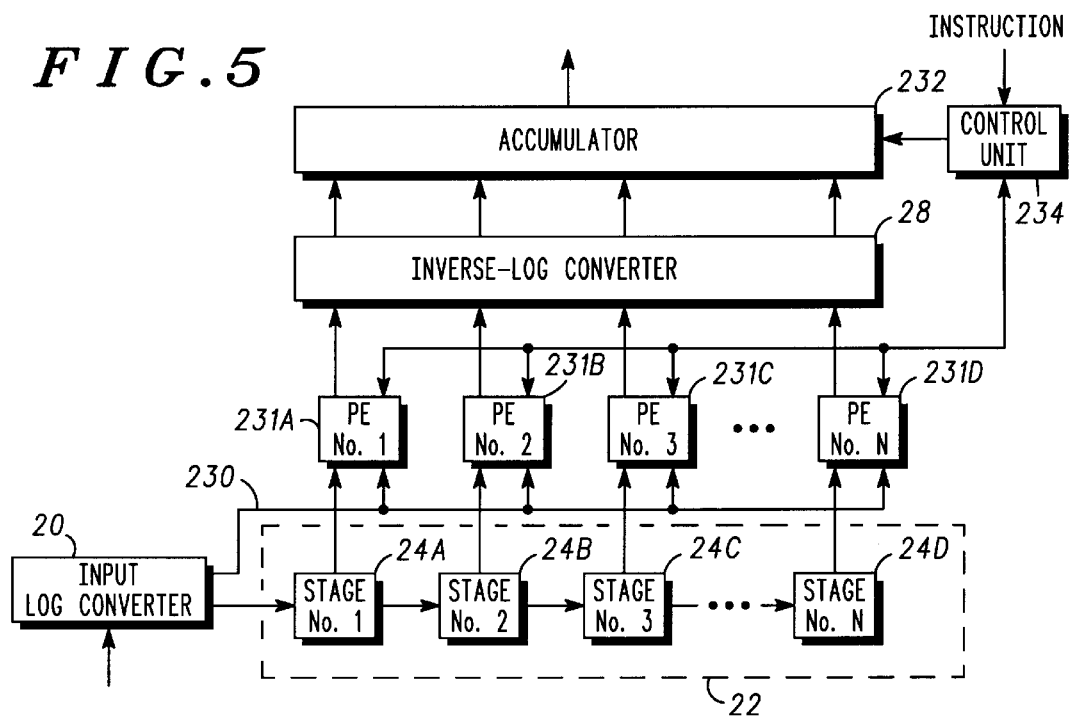
FIG. 5 illustrates a block diagram of a second computer processor that can incorporate an embodiment of the present invention.

FIG. 5 illustrates a block diagram of a second computer processor that can incorporate an embodiment of the present invention. Similar to the processor shown in FIG. 1, the computer processor of FIG. 5 includes the input log converter 20, the data pipeline 22 comprising the stages 24a–d, and the inverse-log converter 28. However, in contrast to the processor FIG. 1, the processor of FIG. 5 also includes a bus 230, a programmable accumulator 232, a control unit 234, and a plurality of configurable processing elements 231a–d that response to control signals from the control unit 234 and log signals received on the bus 230.

The configurable processing elements 231a–d perform the same functions of the processing elements 26a–d of FIG. 1, and additionally, the internal structure of each processing element 231a–d is preferably based on the architectures disclosed in above-identified Related Invention No. 2. However, in contrast to the processing elements 26a–d of FIG. 1, the configurable processing elements 231a–d can be individually instructed by the control unit 234 to respond to log signals provided by either the bus 230 or their respective pipeline stage. This additional functionality allows log signals to be either broadcast or sequentially distributed to the processing elements 231a–d, which consequently allows the processor to perform a wider variety of computations. For example, when computing a non-linear polynomial, the log signals are typically distributed across the bus 230, whereas, while computing a linear function, such as an FIR filter, the log signals are usually passed through the data pipeline 22.

In one embodiment of the present invention, each processing element 231a–d includes a means for selectively placing either its bus input or respective stage input in a high-impedance state. In an alternative embodiment of the present invention, a de-multiplexer is used to select the input.

The processing elements 231a–d can also be configured to perform different functions according to the control signal from the control unit. For example, if the processor is to perform a certain computation, such as a DFT or a autocorrelation, each processing element 231a–d can be instructed to use a specific set of coefficient and exponential values (exponent codes) corresponding to the computation. Typically, these values are stored within the processing elements 231a–d.

Operation of the computer processor typically proceeds as follows. Initially, the computer processor is configured for run-time execution. This is accomplished when an instruction is received by the control unit 234. The control unit 234 then decodes the instruction to generate a first control signal and second control signal. The first control signal is used to configure the accumulator 232 to perform specific summing operations, while the second control signal is used to configure the processing elements 231a–d.

There are many approaches to realizing the control unit 234. In a digital system, the control unit 234 could be implemented as either a hard-wired control sequencer or a microprogrammable control unit. Generally, a hard-wired control sequencer is a sequential circuit realization of a finite state machine. A microprogrammable control unit, on the other hand, generates control signals by decoding a sequence of instructions that are stored in a memory. For instance, a microprocessor may be used to implement a microprogrammable control unit.

The accumulator 232 may be configured to perform any one of four different functions. In the first configuration, the accumulator 232 functions as an adder tree. In other words, the accumulator 232 generates output signals by summing the inverse-log signals associated with a predetermined set of the processing elements 231a–d. In the second configuration, the accumulator 232 functions as a plurality of individual accumulators. Under this configuration, each of the individual accumulators generates output signals by summing the inverse-log signals associated with a predetermined one of the processing elements. Under the third configuration, the accumulator 232 functions as an adder tree used in conjunction with an accumulation unit. In this configuration, the adder tree sums the inverse-log signals associated with the predetermined set of the processing elements, while the accumulation unit sums the adder tree outputs, over time, to produce output signals. Under the fourth configuration, the accumulator 232 simply passes the inverse-log signals as output signals without any summation being performed.

The processing elements 231a–d involved in the summation operations are predetermined according to the instruction received by the control unit 234.

Figure 6:
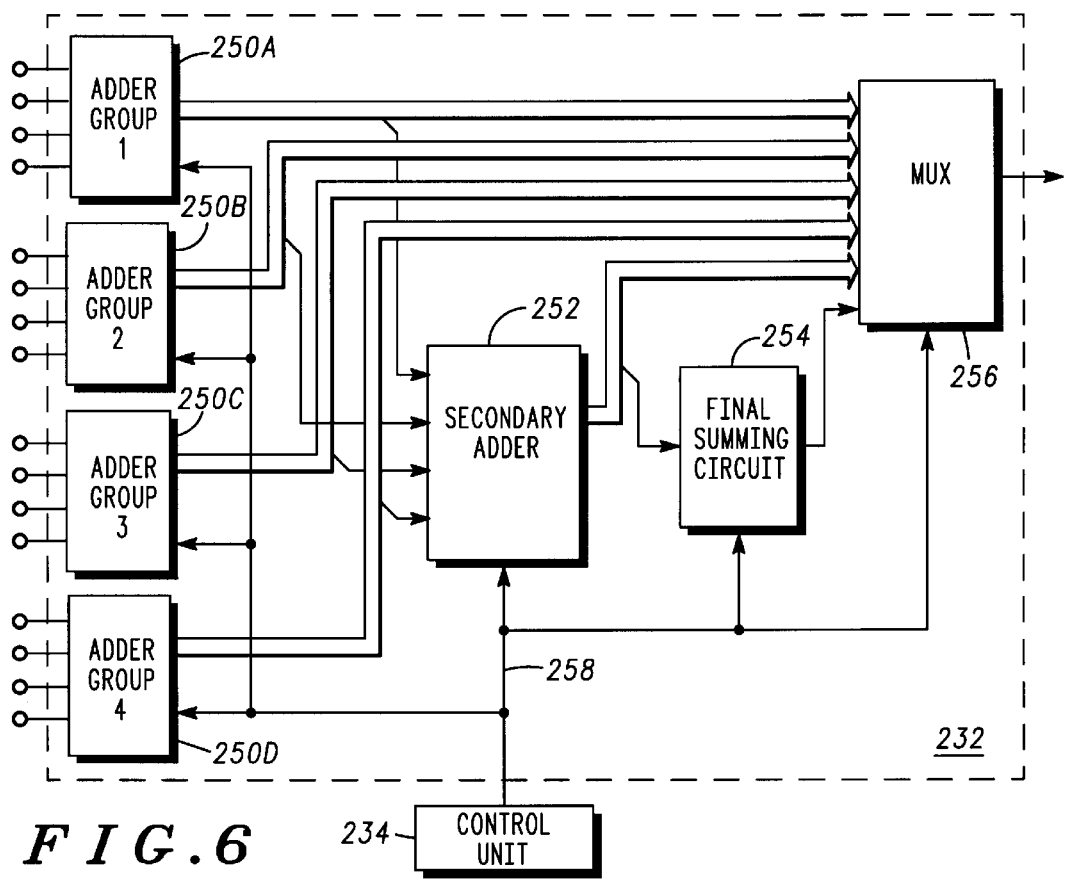
FIG. 6 illustrates a block diagram of the accumulator incorporated in the computer processor of FIG. 5.

FIG. 6 illustrates a detailed block diagram of the accumulator incorporated in the computer processor of FIG. 5. Generally, the accumulator 232 includes an accumulator disclosed in above-identified Related Invention No. 3. In a preferred embodiment of the present invention, the accumulator 232 comprises a plurality of adder groups 250a–d, a secondary adder 252, a final summing circuit 254, and a multiplexer 256. The adder groups 250a–d sum the inverse-log signals to produce a plurality of primary signals. These primary signals are provided as input to both the secondary adder 252 and the multiplexer 256. Each adder group 250a–d has a plurality of output ports; and although an adder group may have any number of output ports, in the example shown each adder group has four output ports. All of the output ports are connected to the multiplexer 256, while only one output port from each adder group is connected to the secondary adder 252. The secondary adder 252 sums primary signals from each of the adder groups 250a–d to generate at least one secondary sum. The secondary sums are then provided to the final summing circuit 254 and the multiplexer 256. The final summing circuit 254 sums, over time, a sequence of secondary sums to produce a final sum. The final sum is provided to the multiplexer 256. The control unit 234 provides control signals to the adder groups 250a–d, the secondary adder 252, the final summing circuit 254, and the multiplexer 256 over a control bus 258. By issuing various control signals at different times, the control unit 234 can route, at a minimum, at least one secondary sum to the mux output and configure each of the adder groups 250a–d to generate the at least one primary sum.

The multiplexer 256 selects outputs from the adder groups 250a–d, secondary adder 252 or final summing circuit 254 to be provided as output signals. The signals presented as output are determined according to a control sequence that is executed by the control unit 234.

The control unit 234 can configure the accumulator 232 to accumulate any combination of the log signals. For example, the accumulator 232 can be configured to individually accumulate the inverse-log signals associated with each of the processing elements 231a–d to generate a plurality of individual processor sums. These sums can then be sequentially provided on the mux output. This is accomplished by setting the adder groups 250a–d to function as a plurality of serial accumulators. The multiplexer 256 then sequential selects each of output of the adder groups 250a–d to be provided on the computer output 140. Another possible configuration allows when all the inverse-log signals to be accumulated, over a period of time, into a single sum. This can be accomplished by the adder groups 250a–d summing the their respective inputs to generate primary sums. The primary sums are then summed by the secondary adder 252 to produce a secondary sum that represents the total of the processing element outputs for a given addition cycle. The secondary sums for a plurality of addition cycle can then be accumulated, over time, by the final summing circuit 254 to generate the single sum. The output of the final summing circuit 254 is selected by the multiplexer to provide the output signals.

Figure 7:
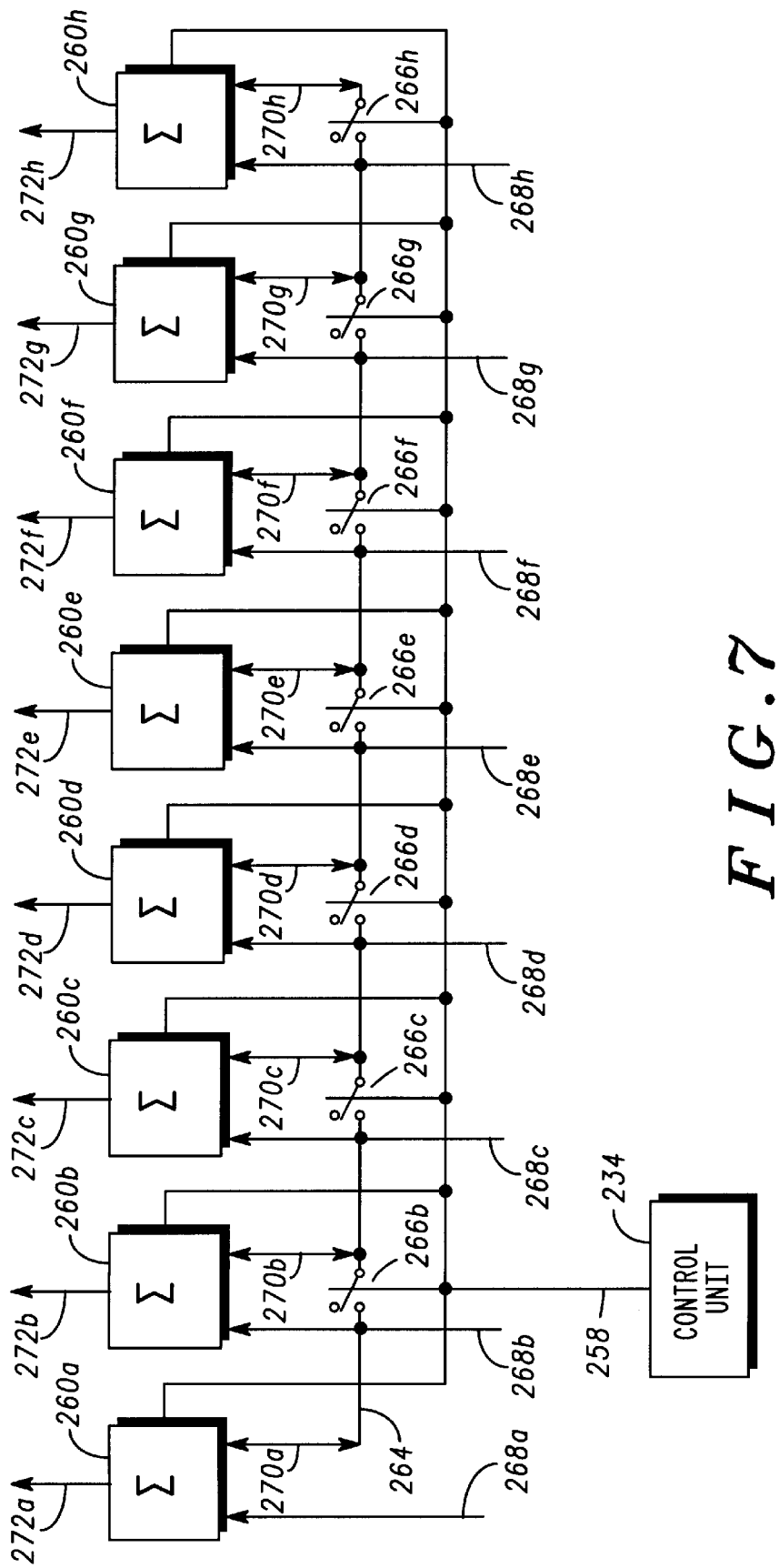
FIG. 7 illustrates a block diagram of an adder group utilized by the accumulator of FIG. 7.

FIG. 7 illustrates a detailed block diagram of an adder group that can be utilized by the accumulator of FIG. 6. The adder group comprises a bus 264, a plurality of summing circuits 260a–h, and a plurality of switches 266b–h. The control unit 234 is connected to each of the summing circuits by a control bus 258.

A significant advantage of the adder group is that it can function as either a parallel accumulator or a plurality of serial accumulators. The actual function of the adder group depends upon a sequence of control signals issued by the control unit 234.

The summing circuits 260a–h are adjacently coupled to the bus 264. Each of the summing circuits 260a–h has a bi-directional port 270a–h and an input port 268a–h connected to the bus 264. In addition, each summing circuit has an output port 272a–h. The summing circuits 260a–h receive a plurality of input signals (inverse-log signals) on the input ports 268a–h and then sum the input signals to generate a plurality of intermediate signals. Each summing circuit 260a–h can generate an intermediate signal on either its corresponding output port 272a–h or bi-directional port 270a–h, depending on how the summing circuit is configured by the control unit 234.

The plurality of switches 266b–h are for regulating the transmission of signals on the bus 264. Each switch is located on the bus 264 between the input port and the bi-directional port of a respective one of the summing circuits. In addition, each of the switches 266b–h can be independently placed in either an open position or a closed position. In an open position, a switch will prevent signals from passing through to the remainder of the bus 264. In a closed position, a switch will allow signals to pass along the bus 264. For example, if an input signal is received on the input port 268c of the third summation circuit 260c while the first switch 266b is closed and the second switch 266c is open, then the input signal will be distributed across the bus 264 to the bi-directional ports 270a–b of the first and second summing circuits 260a–b and to the input ports 268b–c of the second and third summing circuits 260b–c. The position of each switch is determined by a respective control signal issued by the control unit 234 and distributed across the control bus 258. In an integrated circuit, each switch can be implemented using a MOS (metal oxide semiconductor) pass transistor.

In addition to configuring each of the switches 266b–h, the control unit 234 configures the bi-directional port 270a–h of each of the summing circuits 260a–h to either receive or transmit data. At least one control signal for independently regulating the bi-directional port of each summing circuit is provided by the control unit 234 over the control bus 258. Each summing circuit includes a transceiver, which is responsive to the control signal, for setting the data flow direction of the bi-directional port. The details of the summing circuits are further described in reference to FIGS. 5 and 6 of above-identified Related Invention No 3.

By asserting various control signals at different times, the control unit 234 routes the intermediate signals to be either transmitted as output signals on the output ports 272a–h or across the bus 264 to be received as input by another one of the of summing circuits 260a–h. For instance, to sum intermediate signals generated by the first summing circuit 260a and the third summing circuit 260c, the control unit 234 first issues a control signal that opens the first and fourth switches 266b,d and closes the second switch 266c. Then, the control unit 234 issues another control signal that causes the first and third summing circuits 260a,c to place their intermediate signals on their respective bi-directional ports 270a,c. The second summing circuit then receives the intermediate sum of the first summing circuit 260a on its input port 268b and the intermediate sum of the third summing circuit 260c on its bi-directional port 270b.

Although the adder group of FIG. 7 is shown having a topology that includes eight summing circuits 260a–h, one of ordinary skill in the art will realize that the adder group may be have any number of summing circuits, and yet still embody the concept and spirit of the present invention.

Operational Example of the Adder Group of FIG. 7

Two operational examples will be given for the adder group: (1) parallel accumulation mode and (2) serial accumulation mode. Although only two modes of operations are presented here, many others are possible, as the control unit 234 can configure the adder group to sum any combination of input signals.

The example for parallel accumulation demonstrates the accumulation of eight input signals into a single output sum. During parallel accumulation, the control unit 234 initially issues a control signal that causes all of the switches 266b–h to open. Then, input signals are received, one on each of the input ports 268a–h. During the first addition cycle, the control unit 234 issues a control signal that causes every other summing circuit to generate an intermediate sum from the input signals. In other words, the first summing circuit 260a sums the input signals received on the first pair of input ports 268a–b; the third summing circuit 260c sums the input signals received on the second pair of input ports 268c–d; the fifth summing circuit 260e sums the input signals received on the third pair of input ports 268e–f; and the seventh summing circuit 260g sums the input signals received on the fourth pair of input ports 268g–h.

Next, during the second addition cycle, the four intermediate sums are added together to generate two further intermediate sums. The intermediate sums from the first and third summing circuits 260a,c are summed by the second summing circuit 260b to generate another intermediate sum. To accomplish this, the control unit 234 issues a control signal that opens the first and third switches 266b,d and closes the second switch 266c. The control unit 234 then causes the first and third summing circuits 260a,c to transmit their intermediate sums on their respective bi-directional ports 270a,c. Near this time, the control unit 234 also issues a control signal to cause the second summing circuit to receive signals on its bi-directional port 270b.

A like procedure as described above for the second addition cycle is also performed to sum the intermediate sums produced by the fifth and seventh summing circuits 260e,g. In this case, the control unit 234 opens the fifth switch 266f and closes the sixth switch 266g. The intermediate sums from the fifth and seventh summing circuits 260e,g are then transmitted across the bus 264 to the input port 268f and the bi-directional port 270f, respectively, of the sixth summing circuit 260f. As a result, the sixth summing circuit 272f generates a further intermediate sum.

During the third addition cycle, the intermediate sums generated by the second and sixth summing circuits 260b,f are summed to produce a final output sum. The control unit 234 asserts a control signal which opens the second switch 266c and closes the third, fourth, and fifth switches 266d–f. The control unit 234 then causes the intermediate sums of the second and sixth summing circuit 260b,f to be transferred across the bus 264 to the input port 268c and the bi-directional port 270c, respectively, of the third summing circuit 260c. The third summing circuit 272c sums these values and provides the result on its output port 272c. The value on the output port 272c is the final output sum generated by the adder group.

When a summing circuit is inactive, i.e., it is not being used during an addition cycle, it's bi-directional port is held in a high impedance state, and further, it does not otherwise respond to signals traveling along the bus 264.

The example for serial accumulation demonstrates the accumulation of eight sequences of input signals into eight separate output sums. During serial accumulation, the control unit 234 initially issues a control signal that causes all switches 266b–h to remain open and all bi-directional ports 270a–h to assume a high impedance state. The sequences of input signals are received, one on each of the input ports 268a–h. Over time, each summing circuit sums it's respective input sequence to generate an output sum on it's corresponding output port 272a–h. These output sums form the output of the accumulator.

Figure 8:
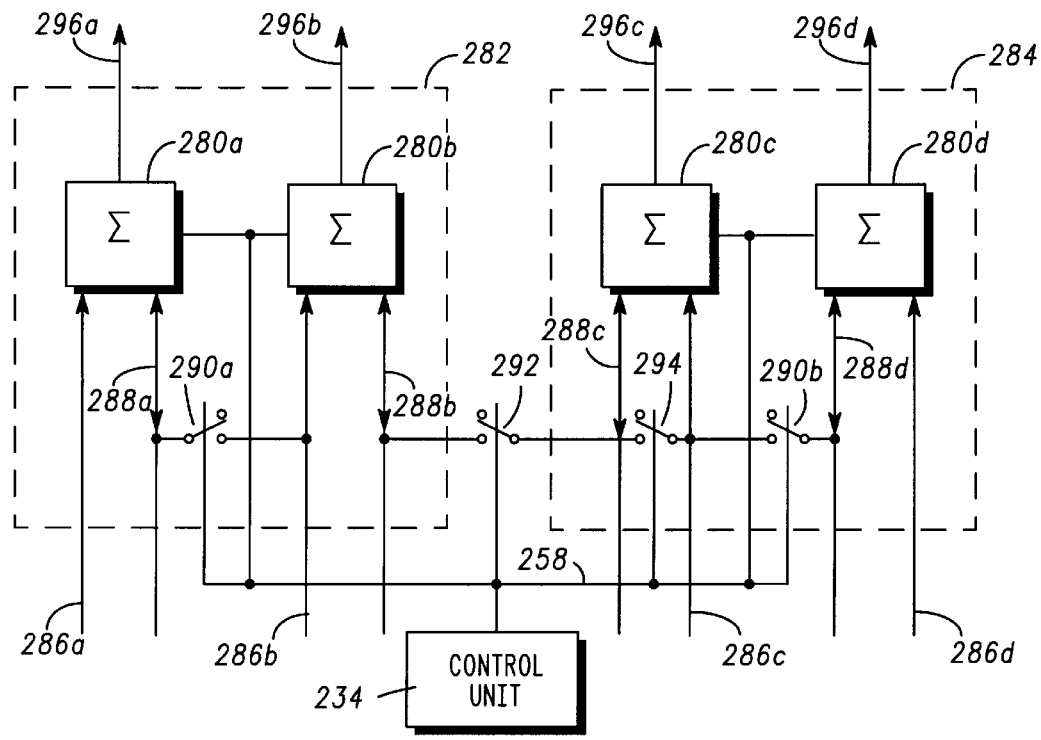
FIG. 8 illustrates a block diagram of a secondary adder utilized by the accumulator of FIG. 7.

FIG. 8 illustrates a detailed block diagram of a secondary adder utilized by the accumulator of FIG. 6. The secondary adder 252 can also function as a plurality of serial accumulators or a plurality of two-input adders.

The secondary adder 252 comprises a control unit 234, a plurality of switches 290a–b, a first center switch 292, a second center switch 294, and a plurality of summing circuits 280a–d. The summing circuits 280a–d are adjacently arranged into a first symmetrical group 282 and a second symmetrical group 284. Each of the symmetrical groups has a respective center summing circuit 280b–c.

In a diagrammatic sense, the symmetrical groups are mirror-images of one another. The first symmetrical group 282 includes a first center summing circuit 280b, while the second symmetrical group 284 includes a second center summing circuit 280c. The center summing circuits 280b–c are distinguished from others because they have their bi-directional ports 288b–c connected with the first center switch 292.

Each of the summing circuits 280a–d has an input port 286a–d and a bi-directional port 288a–d. In addition, each summing circuit has an output port 296a–d. The summing circuits 280a–d receive a plurality of input signals (primary signals) on both the input ports 286a–d and the bi-directional ports 288a–d and then sum the input signals to generate a plurality of intermediate signals. Each summing circuit 280a–d can generate an intermediate signal on either its corresponding output port 296a–d or bi-directional port 288a–d, depending on how the summing circuit is configured by the control unit 234.

The plurality of switches 290a–b are for regulating the transmission of signals between summing circuits within the same symmetrical group. Each of the plurality of switches 290a–b is connected between the bi-directional port and the input port of an adjacent summing circuits within a symmetrical group.

The first center switch 292 connects the bi-directional ports 288b–c of the center summing circuits 296b–c. The first center 292 switch allows intermediate signals to pass between the center summing circuits 280b–c.

The second center switch 294 can be located between the bi-directional and output ports of either the first or second center summing circuit. In the example shown, the second center switch 294 is connected between the bi-directional port 288c and the input port 286c of the second center summing circuit 280c. The purpose of the second center switch 294 is to allow intermediate signals produced on the bi-directional port 288b of the first center summing circuit 280b to reach the input port 286c of the second center summing circuit 280c.

Each of the switches can be independently placed in either an open position or a closed position. In an open position, a switch will prevent a signal from passing. In a closed position, a switch will allow a signal to pass. The position of each switch is determined by a respective control signal issued by the control unit 234 and distributed across the control bus 258. In an integrated circuit, each switch can be implemented using a MOS (metal oxide semiconductor) pass transistor.

In addition to configuring each of the switches, the control unit 234 configures the bi-directional port 288a–d of each of the summing circuits 280a–d to either receive or transmit signals. At least one control signal for independently regulating the bi-directional port of each summing circuit is provided by the control unit 234 over the control bus 258. Each summing circuit includes a transceiver, which is responsive to the control signal, for setting the data flow direction of the bi-directional port. The details of the summing circuits can be found by referring to FIGS. 5 and 6 of above-identified Related Invention No. 3.

By asserting various control signals at different times, the control unit 234 routes the intermediate signals to be either transmitted as output signals on the output ports 296a–d or to other summing circuits 280a–d. For instance, to sum intermediate signals generated by the first summing circuit 280a and the first center summing circuit 280b, the control unit 234 first issues a control signal that opens the first center switch 292 and closes the switch 290a between the two summing circuits 280a–b. Then, the control unit 234 issues another control signal that causes the first summing circuit 280a to generate its intermediate signal on its bi-directional port 288a. The first center summing circuit 280b then receives the intermediate sum on its input port 286b and adds it to its own intermediate sum. The resultant sum generated by the first center summing circuit 280b can be output on either the bi-directional port 288b or the output port 296b.

Although the secondary adder 252 of FIG. 8 is shown having a topology that includes four summing circuits, one of ordinary skill in the art will realize that the secondary adder 252 may be have any number of summing circuits, and yet still embody the concept and spirit of the present invention.

Figure 9:
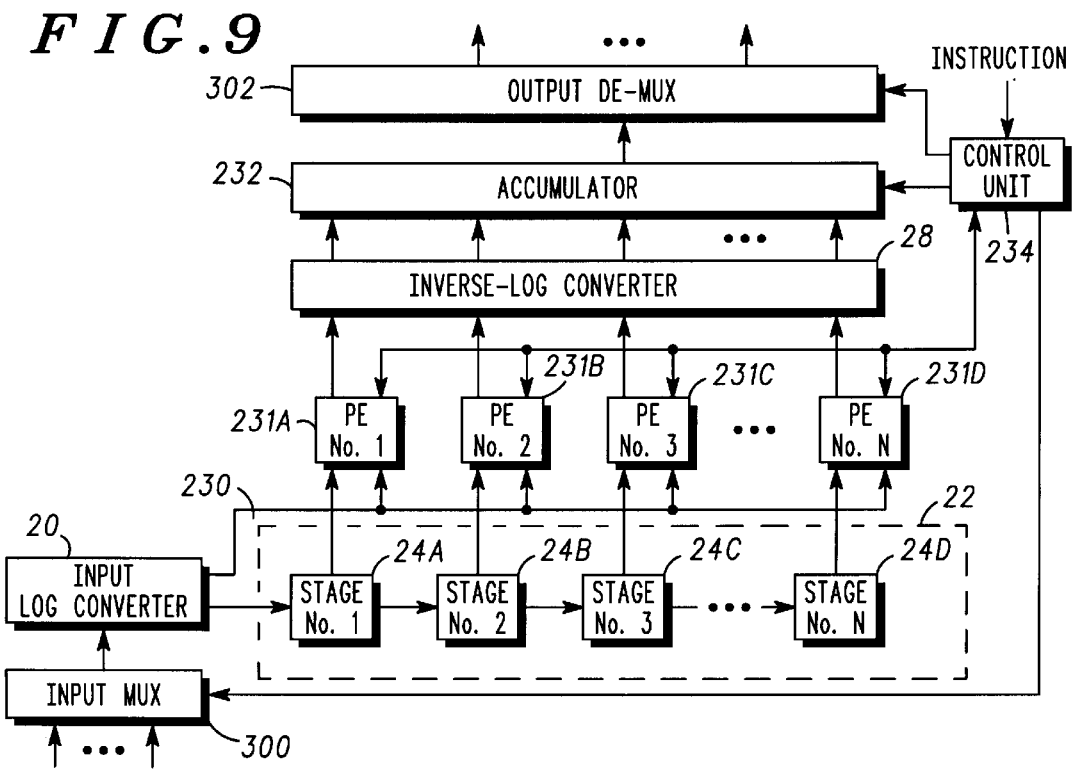
FIG. 9 illustrates a block diagram of a third computer processor that can incorporate an embodiment of the present invention.

FIG. 9 illustrates a block diagram of a third computer processor that can incorporate an embodiment of the present invention. In addition to the elements shown in FIG. 5, the computer processor preferably includes an input multiplexer (mux) 300 and an output de-multiplexer (de-mux) 302. The multiplexer 300 is connected to a plurality of input ports. An input select signal from the control unit 234 selects one of the input ports upon which the input signals are received. The de-multiplexer 302 selectively transmits output signals to one of a plurality of output ports. An output select signal from the control unit 234 determines which port receives the output signals. In addition to transmitting the output signals, the de-multiplexer 302 can also transmit the output addresses to the output ports. The input and output select signals are typically generated by the control unit 234 when it decodes an instruction.

The multiple I/O ports allow the computer processor to receive and process a plurality of data streams. This significantly improves the flexibility of the computer processor in many applications. Data streams having different data rates or processing requirements can be overlapped by the computer processor, thus increasing the overall data throughput of the processor. For example, the computer processor could receive three different data streams—the first stream requiring a DFT, the second a IIR filter, and the third a non-linear polynomial. The processor could perform each operation in a time-sliced fashion. During a first interval, the processor would decode an instruction selecting the first channel and configuring the processor to compute a DFT; during the second interval, another instruction would be decoded that selected the second channel and an IIR filter configuration; and during the third interval, yet another instruction would select the third stream and a non-linear polynomial configuration.

Figure 10:
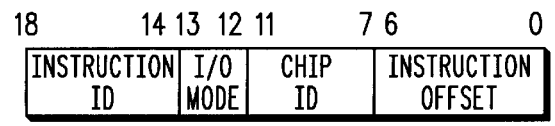
FIG. 10 illustrates an instruction format used by the computer processor shown in FIG. 9.

FIG. 10 illustrates an instruction format used by the computer processor shown in FIG. 9. Although one of ordinary skill will appreciate the fact that a computer instruction may assume many different formats and retain the same meaning, the instruction format of the present invention is preferably a 19-bit digital word that includes the following fields: an instruction ID, I/O mode, chip ID, and offset. The instruction ID is a 5-bit slice that indicates the identity of the instruction. Thus, the preferred format allows the instruction set of the computer processor to comprise up to 32 different instructions. As shown in FIG. 10, the instruction ID includes bits 14–18 of an instruction. The I/O mode is a 2-bit slice that is decoded to generate control signals that configure the input mux 300 and output de-mux 302. The I/O mode is located at bits 12–13 of an instruction. Bits 7–11 of an instruction give the chip ID. The computer processor has an associated 5-bit identification number. The computer processor decodes only those instructions with matching chip IDs. The chip ID field allows an instruction to be distributed to a plurality of computer processors on a common bus with only identified processors responding to the instruction. Bits 0–6 of an instruction give the instruction offset. The instruction offset is decoded to generate the control signal that configures the accumulator 232.

Figure 11:
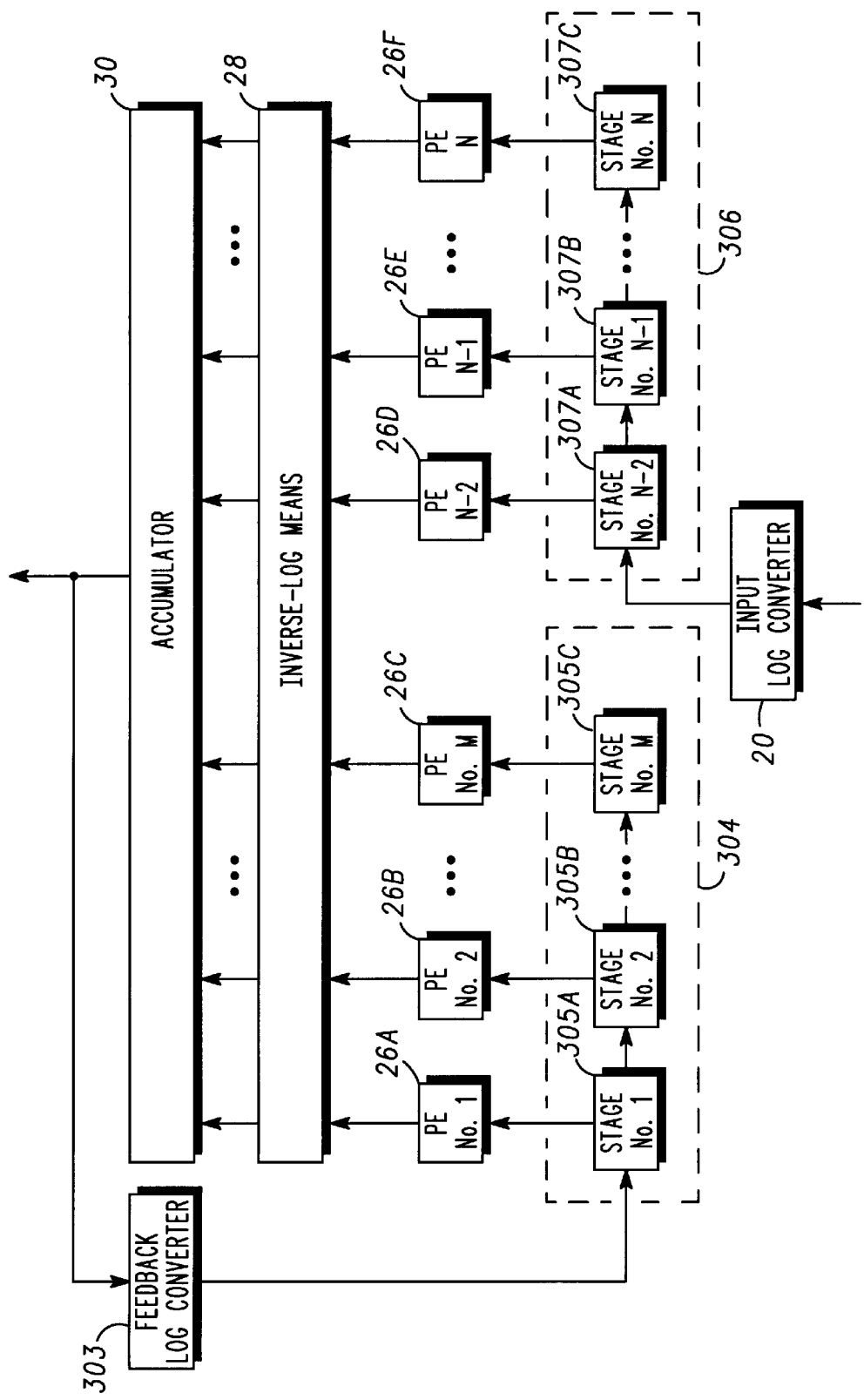
FIG. 11 illustrates a block diagram of a fourth compute processor that can incorporate an embodiment of the present invention.

FIG. 11 illustrates a block diagram of a fourth computer processor that can incorporate an embodiment of the present invention. This computer processor includes a feedback path that is useful during operations requiring feedback, such as L1 and L2 norm computations or IIR filtering. The processor depicted in FIG. 11 includes the input log converter 20, the plurality of processing elements 26a–f, the inverse-log converter 28, and the accumulator 29 shown in FIG. 1. In addition to these elements, the processor of FIG. 11 includes a feedback log converter 303, a first data pipeline 304 having a first plurality of stages 305a–c, and a second data pipeline having a second plurality of stages 307a–c.

The feedback log converter 303 performs logarithmic conversion on the output signals to generate a corresponding plurality of feedback signals. These feedback signals are provided to the first stage 305a of the first data pipeline 304. The feedback log converter 303 can includes any means for performing a logarithmic conversion; however, it preferably includes the log converter described herein with reference to FIG. 2. The output signals can be selectively converted into feedback signals. This can be accomplished in one of two ways: either the accumulator 29 provides selected ones of the output signals or the feedback log converter 303 selects output signals according to their associated output addresses.

The first data pipeline 304 sequentially provides the feedback signals to the first set of processing elements 26a–c, while the second data pipeline 306 sequentially provides the log signals to a second set of processing elements 26d–f. The first and second data pipelines 304, 306 function in substantially the same manner as the data pipeline 22 shown in FIGS. 1, 5 and 9.

Figure 12:
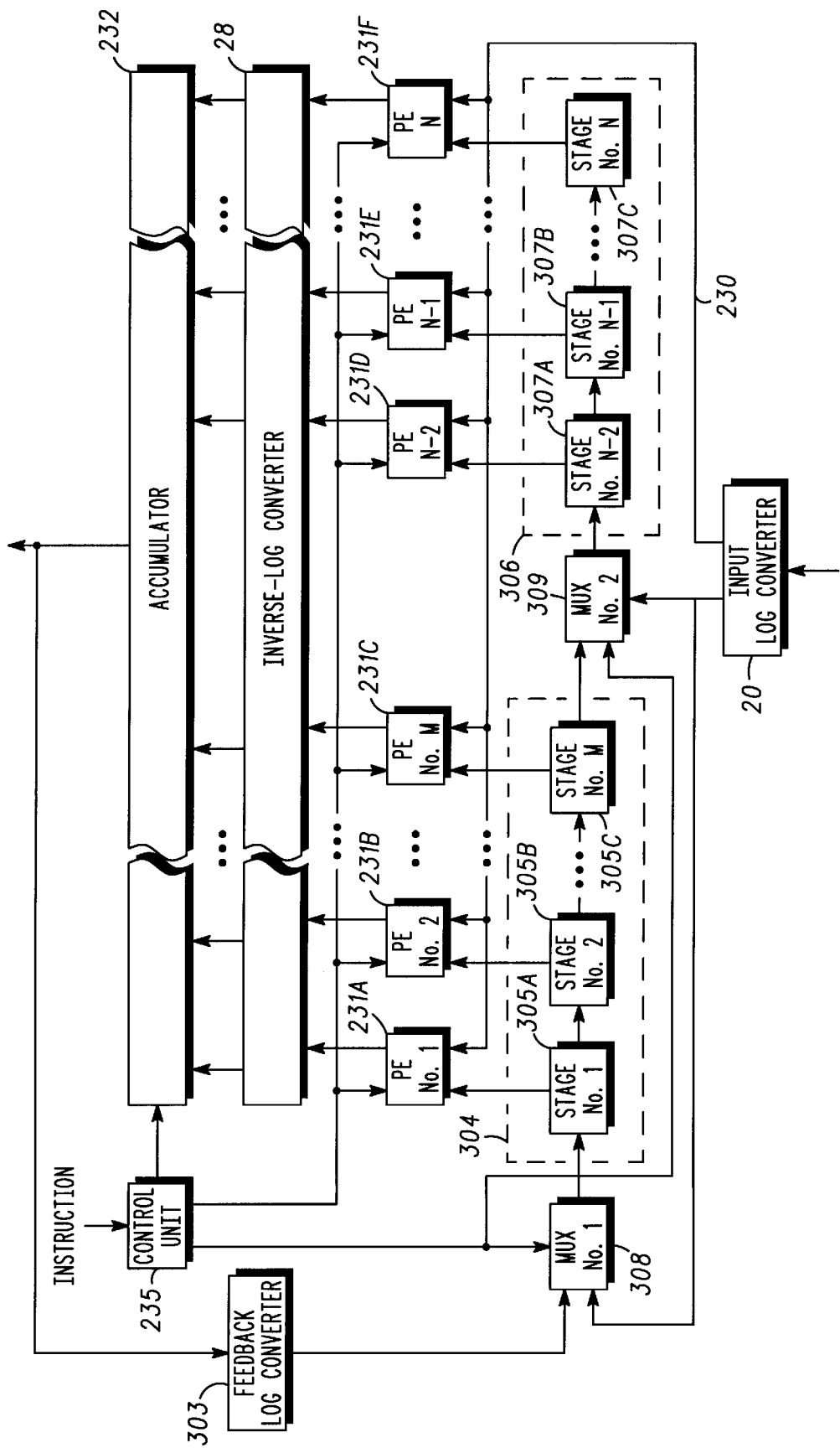
FIG. 12 illustrates a block diagram of a fifth computer processor that can incorporate an embodiment of the present invention.

FIG. 12 illustrates a block diagram of a fifth computer processor that can incorporate an embodiment of the present invention. The processor depicted in FIG. 12 includes the input log converter 20, the plurality of processing elements 231a–f, the inverse-log converter 28, the feedback log converter 303, the first data pipeline 304, the second data pipeline 306, the bus 230, and the accumulator 232 as previously described herein. Along with these elements, the processor of FIG. 12 also includes a control unit 235, a first mux (multiplexer) 308, and a second mux 309. The additional multiplexers allow the processor to operate with either a dual pipeline or single pipeline.

In addition to the functionality and characteristics of the control unit 234 shown in FIGS. 5 and 9, the control unit 235 of FIG. 12 generates control signals that configure the first mux 308 and the second mux 309. These control signals are generated in response to an instruction being decoded by the control unit 234.

The first mux 308 selectively provides either the log signals or the feedback signals as first mux outputs. In turn, the first mux outputs are provided to the first stage 305a. The second mux 309 selectively provides either the first pipeline outputs, from the mth stage 305c, or the log signals as second mux outputs. The second mux outputs are provided to the first stage 307a of the second data pipeline 306.

Figure 13:
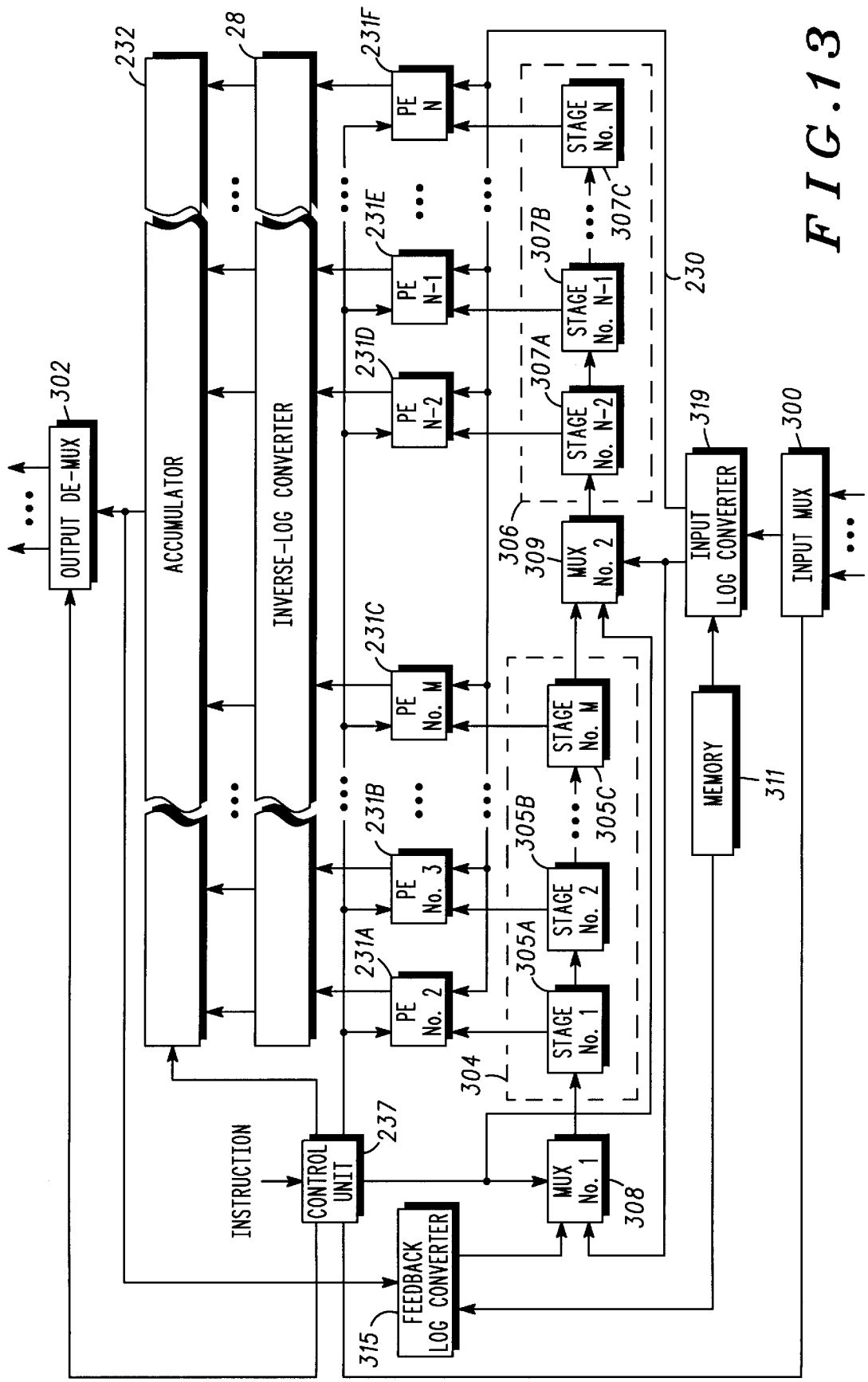
FIG. 13 illustrates a block diagram of a sixth computer processor that can incorporate an embodiment of the present invention.

FIG. 13 illustrates a block diagram of a sixth computer processor that can incorporate an embodiment of the present invention. The processor shown in FIG. 13 includes the input multiplexer 300, the plurality of processing elements 231a–f, the inverse-log converter 28, the first data pipeline 304, the second data pipeline 306, the bus 230, the accumulator 232, the first mux 308, the second mux 309, and the output de-multiplexer 302, as previously described herein. Along with these elements, the computer processor of FIG. 13 also includes a control unit 237, a memory 311, an enhanced input log converter 314 and an enhanced feedback log converter 315.

In addition to the functionality and characteristics of the control unit 235 shown in FIG. 12, the control unit 237 generates control signals that configure the input multiplexer 300 and the output de-multiplexer 302 to select various data streams.

In a preferred embodiment of the present invention, the input log converter 314 and the feedback log converter 315 share a plurality of parameters stored in the memory 311. This reduces the overall silicon space required by the computer processor. The parameters include a zero-order, first-order, and second-order parameter. Essentially, the memory 311 includes the contents of memory 41 of FIG. 2. The memory 311 can be implemented using a dual-port memory that allows both log converters to access the parameters. Each port would be dedicated to one of the log converters 314, 315.

The input log converter 314 can include a signal generator, such as the signal generator 43 shown in FIG. 2. The input log converter 314 receives parameters from the respective port of the memory 311 and input signals to generate the log signals. In like fashion, the feedback log converter 315 can also include a signal generator, such as the signal generator 43. The feedback log converter 315 generates feedback signals in response to parameters from the memory 311 and the output signals.

In one embodiment of the present invention, the computer processor is implemented with a custom microchip. However, one of ordinary skill will recognize that a programmable logic array, application specific integrated circuit (ASIC), or other digital logic device, as well as software running on a processor such as a microprocessor could also be used to implement the computer processor.

In one embodiment of the present invention, the computer processor can compute a polynomial expansion represented by Equation 3 as follows:

$$y = \sum_{i=1}^{m} w_i \; x_1^{g_{1i}} \; x_2^{g_{2i}} \; \ldots \; x_n^{g_{ni}} \qquad \text{Equation 3}$$

In Equation 3, $x_i$ represents the input signals and can be a function such as $x_i = f_i(z_j)$, where $z_j$ is a signal that is pre-processed by a function $f_i$, and where the indices i and j may be any integers; y represents an output signal of the computer processor; w represents a coefficient value; $g_1, \ldots, g_n$ represent the exponent values for the ith term; and n represents the number of input signals.

FIG. 14 shows a flow diagram of a method of using one of the computer processors shown in FIGS. 1, 5 and 9 to generate at least one output signal. In box 320, an instruction is decoded to configure the elements of the processor. Such configuration include selecting a summing operation. In box 322, logarithmic conversion is performed on a plurality of input signals to generate a corresponding plurality of log signals. Next, in box 324, each log signal is transmitted through a data pipeline. The pipeline sequentially presents the log signals at each of a plurality of stages. In box 326, a term signal is generated for each stage in response to each log signal. Thus, a plurality of term signals is generated. Each term signal is based on either Equation 1 or 2, as herein disclosed.

In box 328, inverse-logarithmic conversion is performed on the term signals to generate a plurality of inverse-log signals. Next, in box 330, the inverse-log signals are summed to produce one or more output signals. The inverse-log signals can be selectively summed. For instance, the inverse-log signals associated with a predetermined set of stages can be summed into a single output signal. Or, as another example, each output signal can represent a summation of the inverse-log signals associated with a single predetermined stage. In box 332, an output address is concomitantly generated with each output signal.

FIG. 15 shows a flow diagram of a method of using one of the computer processors shown in FIGS. 11–13 to generate output signals. Steps 320–332 correspond directly to steps 320–332 described in conjunction with FIG. 14. Along with these steps, in box 333, logarithmic conversion is performed on the output signals to generate the plurality of feedback signals. In box 334, each feedback signal is transmitted through the first data pipeline. The first data pipeline sequentially presents the feedback signals at each of a first plurality of stages. In box 335, the log signals are transmitted through the second data pipeline having a second plurality of stages. The second data pipeline sequentially presents the log signals at each of a second plurality of stages.

FIG. 16 shows a block diagram of a digital computer system that incorporates a computer processor embodying the present invention. The digital computer includes a co-processor 340, a microprocessor 342, a computer memory 344, an I/O controller 346, a bus 348, a bus controller 350, and a plurality of I/O devices 356. The digital computer can be used for a wide variety of purposes such as video processing, CAD/CAM simulation, virtual reality, computer graphics, and pattern recognition in general, including speech and handwriting recognition.

The computer memory 344 can be any means for storing an application program 352 and an operating system program 354. The computer memory 344 can be implemented using any combination of ROM, RAM, or mass storage devices such as disk drives. The application program 352 is a software program includes a sequence of instructions that are executable by either the co-processor 340 or the microprocessor 342. The operating system 354 includes at least one software routine for controlling data transfer across the bus 348. Typically, the bus controller 350 interacts with the at least one software routine to manage access of various device connected to the bus 348.

Generally, the microprocessor 342 executes instructions from the application 352 and the operating system 354 that it receives via the bus 348. In response to the execution of these instructions, the co-processor 340 generates a plurality of output signals. The co-processor 340 can receive instruction from either the microprocessor 342 or directly from the computer memory 344. The co-processor 340 can include any of the various computer processors described herein.

The I/O controller 346 allows data to pass between the plurality of I/O devices 356 and other devices connected to the bus 348. Typically, the I/O controller is responsive to the data transfer routines of the operating system 354. The I/O devices 356 provide external interfaces to the digital computer system. The I/O devices 356 may include a CRT display, keyboard, mouse, joy stick, mass storage device such as a disk or tape drive, plotter, printer, VCR, or television.

FIR Filtering Operation

Any of the computer processors depicted in FIGS. 1, 5, 9, or 11–13 can function as an FIR filter. In implementing a digital filter, the input-output relationship of the filter must be converted to a computational algorithm. Generally, the computational algorithm of an FIR filter is represented by a difference equation as shown:

$$y(n) = \sum_{k=0}^{m} b_k x(n-k) \qquad \text{Equation 4}$$

In Equation 4, x(n–k) represents the (n–k)th input in a sequence of input signals, y(n) represents an output signal associated with an nth input signal, $b_k$ represents an FIR coefficient, and k, m, and n are integers.

Figure 17:
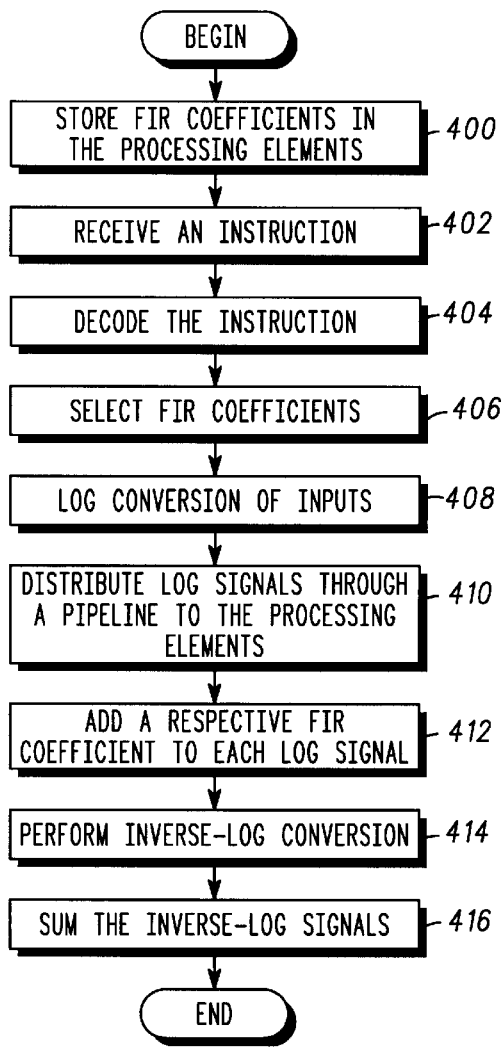
FIG. 17 shows a flow diagram of a method of performing an FIR filtering operation.

Referring now to FIG. 17, a flow diagram of a method of performing a digital FIR filtering is shown. In box 400, a plurality of FIR coefficients are stored in the processing elements. As herein described with reference to FIG. 3, the control unit 201 of each processing element typically includes a memory for storing coefficient values. This memory is loaded with one or more FIR coefficients prior to filtering a stream of input data. These FIR coefficients can include sets of coefficients used by different FIR filters.

In box 402, an instruction is received by the computer processor indicating that digital filtering is to begin. Next, in box 404, the instruction is decoded to select a particular FIR filtering operation. The decoding can be performed by a processor control unit, such as the control units 234, 235, 237 described in conjunction with FIGS. 5, 9, and 12–13. In box 406, FIR coefficients associated with the particular filtering operation are selected according to the instruction.

In box 408, a logarithmic conversion is performed on a sequence of input signals to generate a sequence of log signals. Although any log converter could be used, including those disclosed in above-identified Related Inventions Nos. 4–8, the log signals are preferably generated by estimating a logarithmic function with a second-order polynomial, as described in conjunction with a FIG. 2.

In box 410, the log signals are distributed to the processing elements by transmitting the log signals through a data pipeline. In box 412, each of the processing elements contemporaneously adds an FIR coefficient to one of the log signals. As a result, the processing elements collectively produce a plurality of term signals. The processing elements can be stimulated with control signals to carry out FIR addition cycles. Such control signals are generated as a result of decoding the instruction.

In box 414, an inverse-logarithmic conversion is performed on the term signals to generate a plurality of inverse-log signals. Any inverse-log converter could be used, including those taught by above-identified Related Inventions Nos. 4–7. However, the inverse-log signals are preferably generated by estimating an inverse-logarithmic function with a second-order polynomial, as described herein with reference to FIG. 2. In box, 416, the inverse-log signals are summed to produce the output signal.

It should be noted that the steps shown in boxes 402–406 are optional when using a computer processor that does not include a programmable control unit, such as one of the computer processors depicted in FIGS. 1 or 11.

Figure 18:
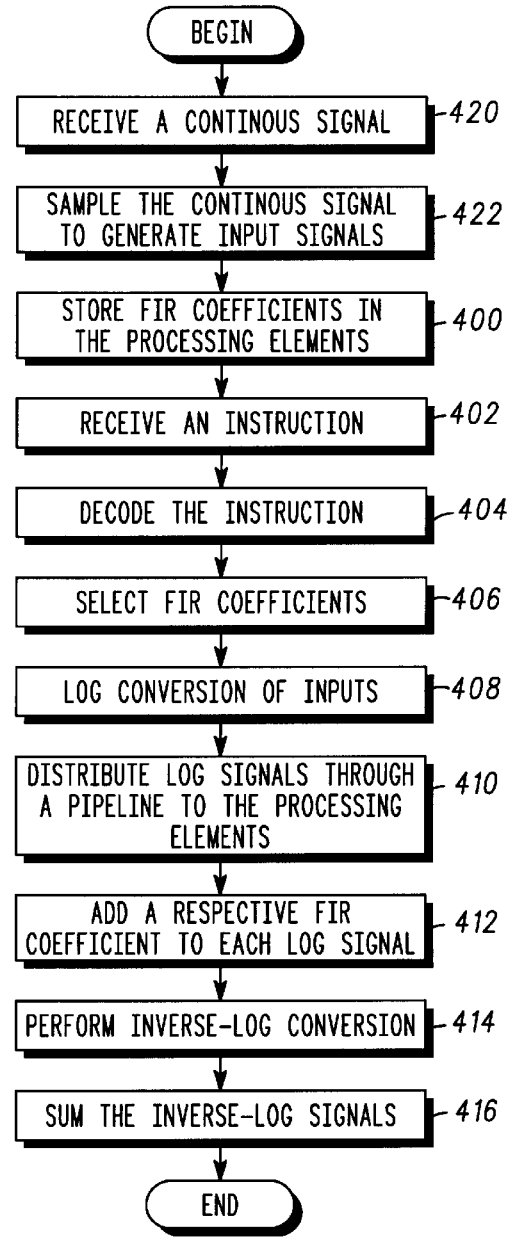
FIG. 18 shows a flow diagram of an alternative method of performing an FIR filtering operation.

FIG. 18 shows a flow diagram of an alternative method of performing an FIR filtering operation. In this method, a continuous signal is filtered. The continuous signal can be an analog signal representing a continuous range of numeric values. Steps 400–416 of FIG. 18 correspond directly to steps 400–416 described in conjunction with FIG. 17. Along with these steps, in box 420, the continuous signal is received by a computer processor, such as one shown in FIGS. 1, 5, 9, or 11–13. In this embodiment, the processor includes an analog port for receiving the continuous signal. In box 422, the continuous signal is sampled at fixed intervals to generate the sequence of input signals. The sampling is typically performed by an A/D converter that can be included in the processor. When included in a processor, the A/D converter can be instructed by a control unit.

The processor can also include a D/A converter and an analog output port for converting the digital output signal of the FIR operation to an analog output signal.

The methods given in FIGS. 17–18 can be implemented as a sequence of instructions in a computer program. When executed, the computer program directs a computer processor, such as one disclosed herein, to perform an FIR filtering operation. The program could be stored in and retrieved from any form of computer-readable memory, such as a floppy disk, hard disk, CD-ROM, ROM, PROM, EEPROM or RAM. The computer program can be implemented using a sequence of microcode instructions stored in a ROM and decoded by a processor control unit. In an alternative implementation, steps 408–416 are implemented using a combination of hardware elements, including the processing elements, data pipeline, log and inverse-log converters. These hardware elements are directed by a control unit executing a sequence of microcode instructions stored in a ROM.

IIR Filtering Operation

Although any of the computer processors disclosed herein can function as an IIR filter, the processors depicted by FIGS. 11–13 are preferably used for IIR filtering since they include elements that provide and process feedback signals. In implementing a digital filter, the input-output relationship of the filter must be converted to a computational algorithm. Generally, the computational algorithm of an IIR filter is represented by a difference equation as shown:

$$y(n) = \sum_{k=0}^{m} b_k x(n-k) + \sum_{k=1}^{p} a_k y(n-k) \qquad \text{Equation 5}$$

In Equation 5, x(n–k) represents the (n–k)th input in a sequence of input signals, y(n) represents an output signal associated with an nth input signal, y(n–k) represents an output signal that is fedback, $a_k$ represent a first IIR coefficient, $b_k$ represents a second IIR coefficient, and k, m, n, and p are integers.

Figure 19:
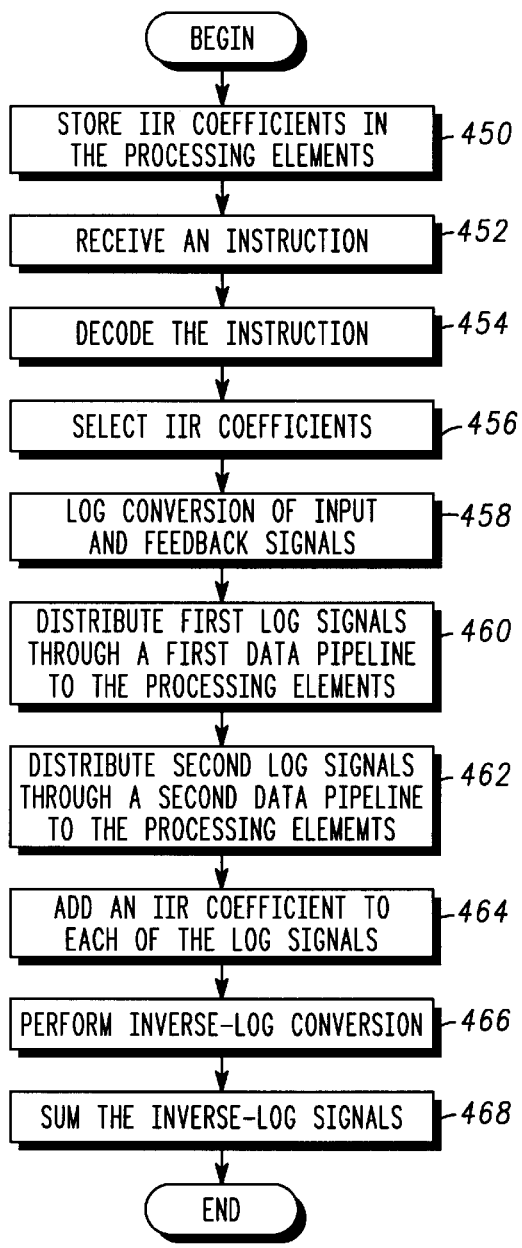
FIG. 19 shows a flow diagram of a method of performing an IIR filtering operation in accordance with one embodiment of the present invention.

Referring now to FIG. 19, a flow diagram of a method of performing a digital IIR filtering operation in accordance with one embodiment of the present invention is shown. In box 450, a plurality of IIR coefficients are stored in the processing elements. As herein described with reference to FIG. 3, the control unit 201 of each processing element typically includes a memory for storing coefficient values. This memory is loaded with one or more IIR coefficients prior to filtering a stream of input data. These IIR coefficients can include sets of coefficients used by different IIR filters.

In box 452, an instruction is received by the computer processor indicating that IIR digital filtering is to begin. Next, in box 454, the instruction is decoded to select a particular IIR filtering operation. The decoding can be performed by a processor control unit, such as the control units 234, 235, 237 described in conjunction with FIGS. 5, 9, and 12–13. In box 456, IIR coefficients associated with the particular filtering operation are selected according to the instruction.

In box 458, a logarithmic conversion is performed on a sequence of input signals to generate a first sequence of log signals. Additionally, a log conversion is also performed on a sequence of feedback signals to generate a second sequence of log signals. As described in conjunction with FIG. 11, the output signals of the filter can be provided as the feedback signals. Although any log converter could be used, including those disclosed in above-identified Related Inventions Nos. 4–8, the sequences of log signals are preferably generated by estimating a logarithmic function with a second-order polynomial, as described in conjunction with a FIG. 2.

In box 460, the first sequence of log signals is distributed to the processing elements by transmitting the first log signals through a first data pipeline. In box 462, the second sequence of log signals is distributed to the processing elements by transmitting the second log signals through a second data pipeline.

In box 464, each of the processing elements contemporaneously adds an IIR coefficient to a log signal from either the first or second sequence. As a result, the processing elements collectively produce a plurality of term signals. In certain embodiments of the present invention, the processing elements are stimulated with control signals to carry out IIR addition cycles. Such control signals are generated as a result of decoding the instruction.

In box 466, an inverse-logarithmic conversion is performed on the term signals to generate a plurality of inverse-log signals. Any inverse-log converter could be used, including those taught by above-identified Related Inventions Nos. 4–7. However, the inverse-log signals are preferably generated by estimating an inverse-logarithmic function with a second-order polynomial, as described herein with reference to FIG. 2.

In box, 468, the inverse-log signals are summed to produce the output signal.

It should be noted that the steps shown in boxes 452–456 are optional when using a computer processor that does not include a programmable control unit, such as the computer processor depicted in FIG. 11.

Figure 20:
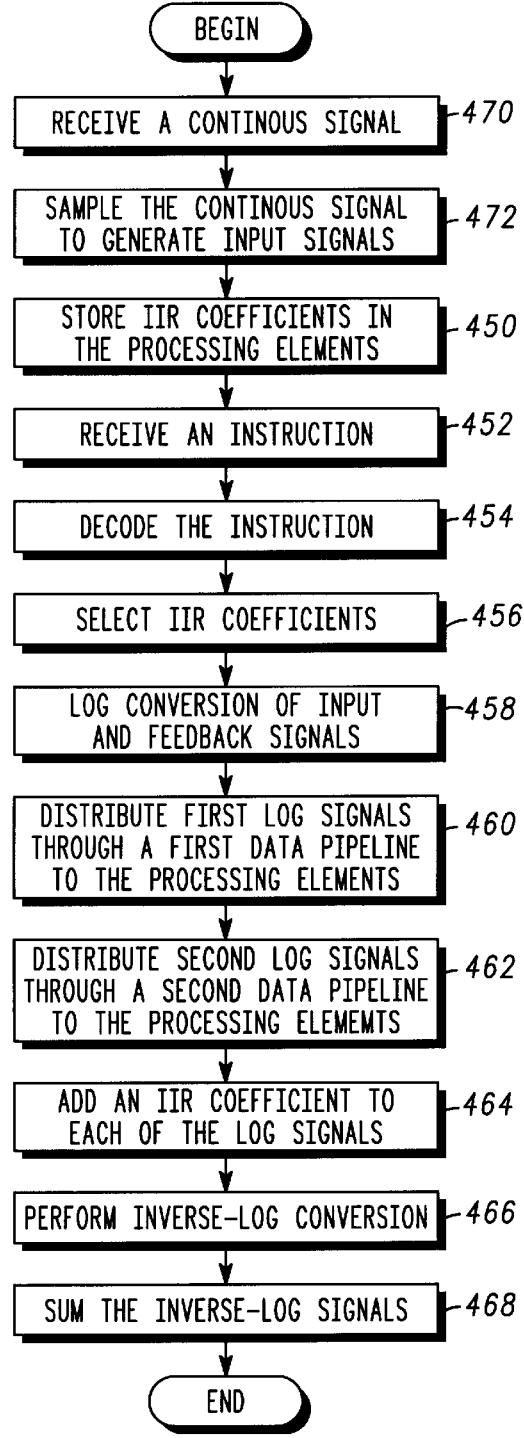
FIG. 20 shows a flow diagram of a method of performing an IIR filtering operation in accordance with an alternative embodiment of the present invention.

FIG. 20 shows a flow diagram of a method of performing an IIR filtering operation in accordance with an alternative embodiment of the present invention. In this embodiment of the present invention, a continuous signal is filtered. The continuous signal can be an analog signal representing a continuous range of numeric values. Steps 450–468 of FIG. 20 correspond directly to steps 450–468 described in conjunction with FIG. 17. Along with these steps, in box 470, the continuous signal is received by a computer processor, such as one shown in FIGS. 1, 5, 9, or 11–13. In this embodiment, the processor includes an analog port for receiving the continuous signal. In box 472, the continuous signal is sampled at fixed intervals to generate the sequence of input signals. The sampling is typically performed by an A/D converter that can be included in the processor. When included in a processor, the A/D converter can be instructed by signals from a control unit.

The processor can also include a D/A converter and an analog output port for converting the digital output signal of the IIR operation to an analog output signal.

The methods given in FIGS. 19–20 can be implemented as a sequence of instructions in a computer program. When executed, the computer program directs a computer processor, such as one disclosed herein, to perform an IIR filtering operation. The program could be stored in and retrieved from any form of computer-readable memory, such as a floppy disk, hard disk, CD-ROM, ROM, PROM, EEPROM or RAM. In one embodiment of the present invention, the computer program is implemented using a sequence of microcode instructions stored in a ROM and decoded by a processor control unit. In an alternative embodiment, steps 458–468 are implemented using a combination of microcode and hardware elements, including the processing elements, data pipelines, log and inverse-log converters. These hardware elements are directed by a control unit executing a sequence of microcode instructions stored in a ROM.

In summary, there has been described herein a concept, as well as several embodiments, including a preferred embodiment, of a method and system for performing an IIR filtering operation. The various embodiments of the IIR filtering operation do logarithmic conversions on input signals prior to performing arithmetic operations, thus allowing the processor to perform mathematical operations at dramatically greater speeds while reducing the size and complexity of the processor in an integrated circuit. By operating in an LNS domain, the processing elements can be implemented using significantly less silicon space.

While specific embodiments of the present invention have been shown and described, it will be apparent to those skilled in the art that the disclosed invention may be modified in numerous ways and may assume many embodiments other than the preferred form specifically set out and described above. For instance, an embodiment of the computer processor as herein described can have any number of stages or processing elements, yet still embody the scope of the present invention.

Accordingly, it is intended by the appended claims to cover all modifications of the invention that fall within the true spirit and scope of the invention.

What is claimed is:

1. A method of performing an IIR filtering operation to produce an output signal comprising the steps of:

decoding an instruction signal to select one of a plurality of filtering operations;

configuring a plurality of processing devices, according to the instruction signal, into a first plurality of processing devices and a second plurality of processing devices;

storing a plurality of predetermined IIR coefficient values in the first and second pluralities of processing devices;

storing a plurality of predetermined log parameters in a feedback log converter;

providing a sequence of input signals to an input log converter;

providing a sequence of output signals to the feedback log converter;

retrieving the plurality of predetermined log parameters from the feedback converter based upon the instruction signal;

performing a logarithmic conversion on the sequence of output signals based upon the plurality of predetermined log parameters to generate a first sequence of log signals;

performing a logarithmic conversion on the sequence of input signals to generate a second sequence of log signals;

distributing the first sequence of log signals through the first data pipeline to the first plurality of processing devices, each of the first processing devices including an adder for summing a log signal and an IIR coefficient;

distributing the second sequence of log signals through the second data pipeline to the second plurality of processing devices, each of the second processing devices including an adder for summing a log signal and an IIR coefficient;

inputting the second sequence of log signals into the second plurality of processing devices;

retrieving the plurality of predetermined IIR coefficients based upon the first and second sequence of log signals;

adding one of the plurality of predetermined IIR coefficients to each of the first sequence of log signals to generate a first plurality of term signals;

adding one of the plurality of predetermined IIR coefficients to each of the second sequences of log signals to generate a second plurality of term signals;

performing inverse-logarithmic conversion on the first and second plurality of term signals to generate a plurality of inverse-log signals; and summing the plurality of inverse-log signals to produce the output signal.

2. The method of claim 1, wherein the term signals are produced from the equation y=w+x;

where y represents a term signal;

w represents a coefficient value; and x represents one of the log signals.

3. The method of claim 1, wherein the term signals are produced from the equation $$y = w + \sum_{i=m}^{n} g_i x_i$$

where y represents a term signal;

w represents a coefficient value;

$x_i$ represents an ith log signal;

$g_i$ represents an exponent value corresponding to the ith log signal; and i, m, and n are integer values.

4. The method of claim 1, further comprising the steps of:

storing a plurality of exponent values in the plurality of processing devices;

retrieving the plurality of exponent values; and using the exponent value to generate the plurality of term signals.

5. The method of claim 1, wherein the plurality of log parameters include a parameter pair and second-order terms.

6. The method of claim 1, wherein the parameter is calculated using a least squares function.

7. The method of claim 1, further comprising the step of selecting one of the plurality of log parameters based upon an address associated with a corresponding log signal.

8. The method of claim 1, wherein step (f) includes generating the first sequence of log signals by estimating a logarithmic function using a second-order polynomial.

9. The method of claim 1, wherein step (g) includes generating the second sequence of log signals by estimating a logarithmic function using a second-order polynomial.

10. The method of claim 1, wherein step (m) includes generating the plurality of inverse-log signals by estimating an inverse-logarithmic function using a second-order polynomial.

11. The method of claim 1, further comprising the following step:

selecting a plurality of IIR coefficients.

12. The method of claim 1, further comprising the following steps:

receiving a continuous signal; and sampling the continuous signal at fixed intervals to generate the sequence of input signals.

13. The method of claim 1, wherein step (m) includes providing one of an instruction from a control unit and an address to each of the plurality of processing devices.

14. In a computer system, a method of performing an IIR filtering operation to produce an output signal comprising the steps of:

storing a plurality of predetermined IIR coefficients in a plurality of processing devices;

storing a plurality of predetermined log parameters in a feedback log converter;

decoding an instruction signal to select one of a plurality of filtering operations;

retrieving the plurality of predetermined log parameters from the feedback log converter;

performing a logarithmic conversion on a sequence of output signals based upon the plurality of predetermined log parameters to generate a first sequence of log signals;

performing a logarithmic conversion on a sequence of input signals to generate a second sequence of log signals;

providing the first sequence of log signals to a plurality of processing elements by transmitting the first sequence of log signals through a first data pipeline;

providing the second sequence of log signals to the plurality of processing elements by transmitting the second sequence of log signals through a second data pipeline;

retrieving the plurality of predetermined IIR coefficients based upon the instruction signal;

configuring each of the processing elements, based upon the instruction signal, to selectively receive either the first sequence or second sequence of log signals from the first and second data pipelines, respectively;

adding one of the plurality of predetermined IIR coefficients to a log signal selected from the group consisting of the first sequence of log signals and the second sequence of log signals, whereby producing a plurality of term signals;

performing an inverse-logarithmic conversion on the plurality of term signals to generate a plurality of inverse-log signals as a function of a plurality of inverse-log parameters calculated using a least squares method to estimate an inverse-log function; and summing the plurality of inverse-log signals to produce the output signal.

15. The method of claim 14, wherein step (a) includes the following sub-step:

generating the first sequence of log signals by estimating a logarithmic function using a second-order polynomial.

16. The method of claim 14, wherein step (d) includes the following sub-step:

generating the second sequence of log signals by estimating a logarithmic function using a second-order polynomial.

17. The method of claim 14, wherein step (h) includes the following sub-step:

generating the plurality of inverse-log signals by estimating an inverse-logarithmic function using a second-order polynomial.

18. The method of claim 14, further comprising the following step:

storing the respective one of the plurality of IIR coefficients in a memory included in one of the plurality of processing elements.

19. The method of claim 14, further comprising the step of:

receiving an instruction; and decoding the instruction to select the IIR filtering operation.

20. The method of claim 19, wherein step (c) includes the following sub-step:

selecting the plurality of IIR coefficients according to the instruction.

21. The method of claim 19, wherein step (k) includes the following sub-steps:

generating a plurality of control signals based on the instruction; and stimulating the plurality of processing elements with the plurality of control signals.

22. The method of claim 16, further comprising the following steps:

receiving a continuous signal; and sampling the continuous signal at fixed intervals to generate the sequence of input signals.

23. A computer-readable memory to store a computer program that directs a computer system to perform an IIR filtering operation, the computer program includes the steps of:

storing a plurality of predetermined IIR coefficients in a plurality of processing devices;

performing logarithmic conversion on a sequence of output signals to generate a sequence of feedback log signals;

performing logarithmic conversion on a sequence of input signals based upon a plurality of predetermined log parameters to generate a sequence of input log signals;

configuring each of the processing devices to receive either the input log signals or the feedback log signals;

distributing the feedback log signals through a first data pipeline to a first plurality of the processing devices;

adding the plurality of predetermined coefficients to the feedback log signals to the input log signals, whereby producing a plurality of term signals;

performing an inverse-logarithmic conversion on the plurality of term signals to generate a plurality of inverse-log signals; and summing the plurality of inverse-log signals to produce an output signal.

24. The computer readable medium of claim 23, wherein the computer-readable memory is selected from the group consisting of: a floppy disk, a hard disk, a CD-ROM, a ROM, a PROM, a EEPROM, and a RAM.

25. The computer-readable medium of claim 23, wherein the computer program is implemented as a sequence of microcode instructions decodable by a control unit.

26. The computer-readable medium of claim 23, wherein step (b) includes generating the first sequence of log signals by estimating a logarithmic function using a second-order polynomial.

27. The computer-readable medium of claim 23, wherein step (c) includes:

generating the second sequence of log signals by estimating a logarithmic function using a second-order polynomial.

28. The computer-readable medium of claim 23, wherein step (e) includes:

generating a plurality of inverse-log signals by estimating an inverse-logarithmic function using a second-order polynomial.

29. The computer-readable medium of claim 23, further comprising the steps of selecting a plurality of IIR coefficients associated with the IIR filtering operation.

30. The computer-readable medium of claim 23, further comprising the steps of:

receiving a continuous signal; and sampling the continuous signal at fixed intervals to generate the sequence of input signals.

* * * * *